US012683551B2

(12) United States Patent
Bagga et al.

(10) Patent No.: US 12,683,551 B2
(45) Date of Patent: Jul. 14, 2026

(54) INJECTION-LOCKED OSCILLATOR

(71) Applicant: NOVELDA AS, Kviteseid (NO)

(72) Inventors: Sumit Bagga, Kviteseid (NO); Torleif Skår, Kviteseid (NO)

(73) Assignee: Vitalthings UWB AS, Trondheim (NO)

( * ) Notice: Subject to any disclaimer, the term of this patent is extended or adjusted under 35 U.S.C. 154(b) by 0 days.

(21) Appl. No.: 18/875,038

(22) PCT Filed: May 16, 2023

(86) PCT No.: PCT/EP2023/063108
§ 371 (c)(1),
(2) Date: Dec. 13, 2024

(87) PCT Pub. No.: WO2023/222686
PCT Pub. Date: Nov. 23, 2023

(65) Prior Publication Data
US 2025/0226798 A1      Jul. 10, 2025

(30) Foreign Application Priority Data

May 18, 2022    (GB) ...................................... 2207301

(51) Int. Cl.
*H03B 5/12* (2006.01)
(52) U.S. Cl.
CPC ......... *H03B 5/1212* (2013.01); *H03B 5/1228* (2013.01); *H03B 2200/0074* (2013.01)
(58) Field of Classification Search
CPC .................................................. H03B 5/1212
(Continued)

(56) References Cited

U.S. PATENT DOCUMENTS

| | | | |
|---|---|---|---|
| 6,249,192 B1 | 6/2001 | Gabara et al. | |
| 10,911,078 B1 * | 2/2021 | Wentzloff | H03B 5/1265 |

(Continued)

FOREIGN PATENT DOCUMENTS

EP          1351428 A1    10/2003

OTHER PUBLICATIONS

Song et al., "A 1.66Gb/s and 5.8pJ/b Transcutaneous IR-UWB Telemetry System with Hybrid Impulse Modulation for Intracortical Brain-Computer Interfaces", 2022 IEEE International Solid-State Circuits Conference, Feb. 20-26, 2022.
(Continued)

*Primary Examiner* — Joseph Chang
(74) *Attorney, Agent, or Firm* — Klarquist Sparkman, LLP

(57)          ABSTRACT

An electronic oscillator circuit comprising: a tank circuit comprising an inductor and a capacitor, wherein the inductor and the capacitor each have a first terminal connected to a first side of the tank circuit and a second terminal connected to a second side of the tank circuit; a first current controller; and a second current controller; wherein the first current controller is connected to the first side of the tank circuit; wherein the second current controller is connected to the second side of the tank circuit; wherein the first current controller is arranged such that it can act as a current source for the tank circuit; wherein the second current controller is arranged such that it can act as a current sink for the tank circuit; wherein the first current controller and the second current controller are configured such that when the first current controller and the second current controller are in a first state, an injected current flows from the first current controller to the second current controller through the tank circuit; and when the first current controller and the second current controller are in a second state, no current is injected
(Continued)

into the tank circuit. The injection of current in this way allows energy to be injected to the tank circuit, which forces oscillations in the tank circuit at a predetermined frequency different to the natural resonant frequency of the tank circuit.

21 Claims, 11 Drawing Sheets

(58) Field of Classification Search
USPC ...................................................... 331/117 R
See application file for complete search history.

(56) References Cited

U.S. PATENT DOCUMENTS

| | | | |
|---|---|---|---|
| 2007/0069830 A1 | 3/2007 | Kelkar et al. | |
| 2009/0201097 A1 | 8/2009 | Kossel et al. | |
| 2010/0271082 A1 | 10/2010 | Lu et al. | |
| 2016/0373058 A1* | 12/2016 | Murphy | ............... H03B 5/1228 |

OTHER PUBLICATIONS

Chang et al., "Design and Analysis of CMOS Low-Phase-Noise Low Quadrature Error $V$-Band Subharmonically Injection-Locked Quadrature FLL", IEEE Transactions on Microwave Theory and Techniques, 66(6):2851-2866, 2018.
International Search Report and Written Opinion for PCT Application No. PCT/EP2023/063108, mailed Oct. 30, 2023, 18 pages.
Search Report for Great Britain Application No. GB2207301.9, dated Nov. 21, 2022, 4 pages.
Tiebout, "A CMOS Direct Injection-Locked Oscillator Topology as High-Frequency Low-Power Frequency Divider", IEEE Journal of Solid-State Circuits, 39(7):1170-1174, 2004.

\* cited by examiner

PRIOR ART

300

210

320

110

PRIOR ART

INJECTION-LOCKED OSCILLATOR

BACKGROUND OF THE INVENTION

This invention relates to electronic oscillators, and in particular to an injection-locked oscillator for generation of a periodic signal in a CMOS circuit.

Generating and locking periodic signals is conventionally achieved using phase-locked loops (PLLs). However, phase-locked loops have significant locking times (microseconds), and are unable to be provide 'locked' signals with response times in the nanosecond and/or sub-nanosecond range.

The present invention seeks to provide an electronic oscillator with a fast response rate (i.e., which is able to kick-start oscillations and lock onto a reference/injection pulse in the nanosecond range) and low-power requirements. This reference locked signal may be used for example to generate an ultra-wide band transmit pulse or to provide a clock for an analog-to-digital converter (ADC).

SUMMARY OF THE INVENTION

From a first aspect, the invention provides an electronic oscillator circuit comprising:

a tank circuit comprising an inductor and a capacitor, wherein the inductor and the capacitor each have a first terminal connected to a first side of the tank circuit and a second terminal connected to a second side of the tank circuit;

a first current controller; and a second current controller;

wherein the first current controller is connected to the first side of the tank circuit;

wherein the second current controller is connected to the second side of the tank circuit;

wherein the first current controller is arranged such that it can act as a current source for the tank circuit;

wherein the second current controller is arranged such that it can act as a current sink for the tank circuit;

wherein the first current controller and the second current controller are configured such that when the first current controller and the second current controller are in a first state, an injected current flows from the first current controller to the second current controller through the tank circuit; and when the first current controller and the second current controller are in a second state, no current is injected into the tank circuit.

Thus, it will be seen that, in accordance with this disclosure there is provided an electronic oscillator circuit comprising first and second current controllers connected across a tank circuit, configured to inject a current through the tank circuit. The injection of current in this way allows energy to be injected to the tank circuit, which, if performed appropriately, forces oscillations in the tank circuit at a predetermined frequency different to the natural resonant frequency of the tank circuit. Thus, when no injected signal is applied, the tank circuit oscillates at its natural resonant frequency (determined by the sizes of the inductor and the capacitor), and when a current is injected at an injection frequency close to (or having an $N^{th}$ harmonic component close to) the natural resonant frequency of the tank circuit, the frequency of the oscillating signal in the tank circuit is 'pulled' to the injection frequency (or $N^{th}$ harmonic component thereof).

The injection frequency may be selected to be (or to have an $N^{th}$ harmonic component that is) as close to the resonant frequency as possible, in order to reduce the presence of signals at frequencies other than the injection frequency or its $N^{th}$ harmonic (i.e., the frequency to which the tank circuit locks). In particular, the injection frequency may be selected such that the amplitude of "side spurs" at frequencies close to the injected signal is below 30 dB, in order to ensure spectral compliance. This may allow the electronic oscillator circuit to be used as part of a transmitter. In particular, it may be suitable for a transmitter that requires a degree of spectrum compliance, e.g., for certain UWB transmissions.

In some examples, the first and second current controllers may be switches. However, in some examples, the first and second current controllers may be amplifiers. In some preferred examples, the first and second current controllers may be transistors. In some such examples, the first current controller may be a PMOS transistor, and the second current controller may be an NMOS transistor.

The electronic oscillator circuit may comprise one or more oscillation sustaining components or circuits in order to counteract losses that arise due to intrinsic impedance in the tank. In some examples, the electronic oscillator circuit may comprise one or more negative impedance components to overcome the intrinsic impedance of the tank circuit and thereby maintain oscillations within the tank circuit that would otherwise be damped due to resistive losses. Such negative impendence components therefore serve to facilitate oscillations within the tank circuit, such that oscillations are sustained rather than damped as a result of the negative impedance. The negative impedance components may take the form of one or more negative impedance circuits. In some such examples, the negative impedance components may comprise one or more cross-coupled pair circuits. Thus, in some examples, the electronic oscillator circuit comprises a first cross-coupled pair circuit connected to the tank circuit. The cross-coupled pair circuit may be connected upstream of the tank circuit. Such a cross-coupled pair circuit may comprise a pair of cross-coupled PMOS transistors, the source of each of the PMOS transistors being connected to a power supply rail or other supply of current. The gate of a first PMOS transistor of the pair of cross-coupled PMOS transistors may be connected to the drain of a second PMOS transistor of the pair of cross-coupled PMOS transistors, and the gate of the second PMOS transistor of the pair of cross-coupled PMOS transistors may be connected to the drain of the first transistor of the pair of cross-coupled PMOS transistors.

In some examples, the electronic oscillator circuit comprises a cross-coupled pair circuit connected to the tank circuit. The cross-coupled pair circuit may be connected downstream of tank circuit. Such a cross-coupled pair circuit may comprise a pair of cross-coupled NMOS transistors, the source of each of the NMOS transistors being connected to ground or other sink of current. The gate of a first NMOS transistor of the pair of cross-coupled NMOS transistors may be connected to the drain of a second NMOS transistor of the pair of cross-coupled NMOS transistors, and the gate of the second NMOS transistor of the pair of NMOS transistors may be connected to the drain of the first NMOS transistor of the pair of NMOS transistors.

The terms "upstream" and "downstream" here refer to the direction of flow of DC current from the power supply rail (or other supply of current) to the ground rail (or other sink of current) (or high rail to low rail).

In some examples, the electronic oscillator circuit comprises an injection clock source configured to apply a clock signal to the first and second current controllers with a predetermined duty cycle such that the first current controller and the second current controller transition from the second state to the first state in response to the clock signal (i.e., the injection signal). This results in an injected current flowing from the first current controller (i.e., the supply) to the second current controller (i.e., ground or other sink of current) through the tank circuit at a frequency set by the clock (injection) signal, i.e., set by the duty-cycle of the injection clock source.

The duty-cycle of the injection clock source may, in some examples, be selected such that it causes the first current controller and the second current controller to transition from the second state to the first state at a frequency close to, or having a harmonic component (e.g., $N^{th}$ harmonic) close to, the resonant frequency of the tank circuit. This may allow the injected current to cause oscillations in the tank circuit at a predetermined frequency by injection-locking oscillations of the tank circuit to said frequency or harmonic component thereof.

In some examples, the capacitor and the inductor may be connected in parallel in the tank circuit to form an LC tank circuit. In some examples, the capacitor may be one of a switchable bank of capacitors, in order to allow the resonant frequency of the tank circuit to be tuned. In some examples, the capacitor may be a variable capacitor (e.g., a varactor), the capacitance of which may be controllable.

From a second aspect, this invention provides an electronic oscillator circuit comprising:

a tank circuit comprising a first inductive winding and a capacitor; and an injection circuit comprising a second inductive winding and a current controller;

wherein the injection circuit is not electrically connected to the tank circuit;

wherein the current controller is configured such that when it is in a first state, an injected current flows from the current controller through the second inductive winding;

wherein the current controller is configured such that when it is in a second state, no injected current flows through the second inductive winding; and wherein the first inductive winding and the second inductive winding are coupled such that the injected current in the second inductive winding of the injection circuit causes a corresponding injected current to be induced in the first inductive winding of the tank circuit.

In accordance with the second aspect of this disclosure, there is provided an electronic oscillator circuit comprising two circuits that are not electrically connected, in which an injection circuit comprises a current controller which may be used to inject a current across an inductive winding of the injection circuit. This current injection causes a corresponding current to be induced in the inductive winding of the tank circuit, resulting in current injection into the tank circuit. The injection of current into the tank circuit allows energy to be injected into the tank circuit. If performed appropriately, this forces oscillations in the tank circuit at a predetermined frequency, different to the natural resonant frequency of the tank circuit. This may allow generation of an oscillating signal in the tank circuit at a predetermined frequency.

The two circuits are not electrically connected in the sense that current does not flow directly from one to the other, but rather they are coupled in the sense that a current is induced in one circuit by the other circuit, e.g., through electromagnetic coupling. The two circuits may therefore be arranged such that they are not physically connected or not conductively connected, e.g., such that no physical conductor such as a wire or a trace that would allow current to flow from one to the other joins the two circuits together. Instead, the two circuits may be inductively coupled such that energy may be transferred between the two circuits. The two circuits may be mutually coupled.

In some examples, the inductive winding of the tank circuit may comprise a pair of winding parts, i.e., a first winding part and a second winding part, connected between respective first and second sides of the tank circuit and a common terminal. The common terminal may be a centre tap of the inductive winding of the tank circuit, e.g., a contact made to a point approximately halfway along the inductive winding. The first winding part and the second winding part may therefore be arranged such that, in the first winding part, the induced current flows from the centre tap to the first side of the tank circuit, and such that, in the second winding part, the induced current flows from the second side of the tank circuit to the centre tap. The centre tap may, in some examples, be connected to a power supply rail or other supply of current.

The inductive winding of the injection circuit may also comprise a pair of winding parts, i.e., a third winding part and a fourth winding part.

The third and fourth winding parts of the inductive winding of the injection circuit may be connected at a common terminal, which may be a centre tap of the inductive winding of the injection circuit. The third and fourth winding parts may be arranged such that current in both of the third and the fourth winding parts flows towards or away from the common terminal (i.e., in opposing directions), and such that the current induced in the first and second winding parts of the inductive winding of the tank circuit flows in a common direction (i.e., from the first side of the tank circuit to the second side of the tank circuit, or from the second side of the tank circuit to the first side of the tank circuit) as a result of the arrangement of the first and second inductive windings with respect to the third and fourth inductive winding parts. The third and fourth winding parts may thus be mutually coupled in a non-inverting relationship.

In some embodiments, the third and fourth winding parts may be connected between respective power supply rails (or other supplies of current) and a common terminal, which may be a centre tap of the inductive winding of the injection circuit. In such embodiments, the centre tap may be connected to the current controller of the injection circuit, such that the injection current in the third and fourth winding parts flows from the respective power supply rails (or other supplies of current) to the current controller via the centre tap.

In some embodiments, the third and fourth winding parts may instead be connected between respective grounds (or other sinks of current) and a common terminal, which may be a centre tap of the inductive winding of the injection circuit. In such embodiments, the centre tap may be connected to the current controller of the injection circuit, such that the injection current in the third and fourth winding parts flows from the current controller to ground (or other sink of current) via the centre tap.

In arrangements as described above, an injection current in the injection circuit (e.g., at the centre tap of the inductive winding of the injection circuit) can therefore cause an injected current to be induced in, and flow around, the tank circuit. In such examples, the transfer of parasitic capacitance to the tank circuit may be reduced.

In some examples, the current controller may be a switch. However, in some examples, the current controller may be an amplifier. In some preferred examples, the current controller in the injection circuit may be a transistor. In some such examples, the current controller may be a PMOS transistor, and the source of the PMOS transistor may be connected to a power supply rail or other supply of current. In such examples, the inductive winding of the injection circuit may be arranged such that the drain of the PMOS transistor is connected to a terminal at the mid-point of the inductive winding of the injection circuit, e.g., a centre tap. The inductive winding of the injection circuit may therefore be connected between the terminal at the mid-point of the inductive winding and two further terminals connected to ground or other sink of current. In embodiments in which the inductive winding of the injection circuit comprises third and fourth winding parts, the third and fourth winding parts may therefore be connected between the terminal at the mid-point of the inductive winding and ground or other sink of current.

In some alternative examples, the current controller in the injection circuit may be an NMOS transistor, and the source of the NMOS transistor may be connected to ground or other sink of current. In such examples, the inductive winding of the injection circuit may be arranged such that the drain of the NMOS transistor is connected to a terminal at the mid-point of the inductive winding of the injection circuit, e.g., a centre tap. The inductive winding of the injection circuit may therefore be connected between the terminal at the mid-point of the inductive winding and two further terminals connected to the power supply rails (or other supplies of current). In embodiments in which the inductive winding of the injection circuit comprises third and fourth winding parts, the third and fourth winding parts may therefore be connected between the terminal at the mid-point of the inductive winding and the power supply rails (or other supplies of current).

The electronic oscillator circuit may comprise one or more oscillation sustaining components or circuits in order to counteract losses that arise due to intrinsic impedance in the tank. In some examples, the tank circuit of the electronic oscillator circuit may be connected to one or more negative impedance components in order to overcome the intrinsic impedance of the tank circuit in order to maintain oscillations within the tank circuit that would otherwise be damped due to resistive losses. Such negative impedance components may therefore serve to facilitate oscillations within the tank circuit, such that oscillations within the tank circuit are sustained as a result of the negative impedance. The negative impedance components may take the form of one or more negative impedance circuits.

In some examples, the negative impedance components may comprise one or more cross-coupled pair circuits. In some examples, the one or more cross-coupled pair circuits may comprise a first cross-coupled pair circuit connected to the tank circuit. The cross-coupled pair circuit may be connected upstream of the tank circuit. Such a cross-coupled pair circuit may comprise a pair of cross-coupled PMOS transistors, the source of each of the PMOS transistors being connected to a power supply rail or other supply of current. The gate of a first PMOS transistor of the pair of cross-coupled PMOS transistors may be connected to the drain of a second PMOS transistor of the pair of cross-coupled PMOS transistors, and the gate of the second PMOS transistor of the pair of cross-coupled PMOS transistors may be connected to the drain of the first transistor of the pair of cross-coupled PMOS transistors.

In some examples, the cross-coupled pair circuit may comprise a pair of cross-coupled NMOS transistors, the source of each of the NMOS transistors being connected to ground or other sink of current. The gate of a first NMOS transistor of the pair of cross-coupled NMOS transistors may be connected to the drain of a second NMOS transistor of the pair of cross-coupled NMOS transistors, and the gate of the second NMOS transistor of the pair of NMOS transistors may be connected to the drain of the first NMOS transistor of the pair of NMOS transistors. The cross-coupled pair circuit may be connected downstream of tank circuit. In some examples, the electronic oscillator circuit comprises an injection clock source configured to apply a clock signal to the current controller of the injection circuit with a predetermined duty-cycle such that the current controller in the injection circuit transitions from the second state to the first state in response to the clock signal. This may cause an injected current to flow through the inductive winding of the injection circuit at a frequency set by the duty-cycle of the clock signal. This allows a corresponding injection current to be injected through the inductive winding of the tank circuit at a frequency set by the clock signal, as the two windings are mutually coupled.

The duty-cycle of the injection clock source may, in some examples, be selected such that it causes the current controller to transition from the second state to the first state at a frequency close to, or having a harmonic frequency component (e.g., an $N^{th}$ harmonic component) close to, the resonant frequency of the tank circuit. This may allow the injected current to force oscillations in the tank circuit at a predetermined frequency by injection locking the tank circuit to said frequency.

Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

Certain preferred embodiments of the invention will now be described, by way of example only, with reference to the accompanying drawings, in which.

DETAILED DESCRIPTION

Figure 1B:
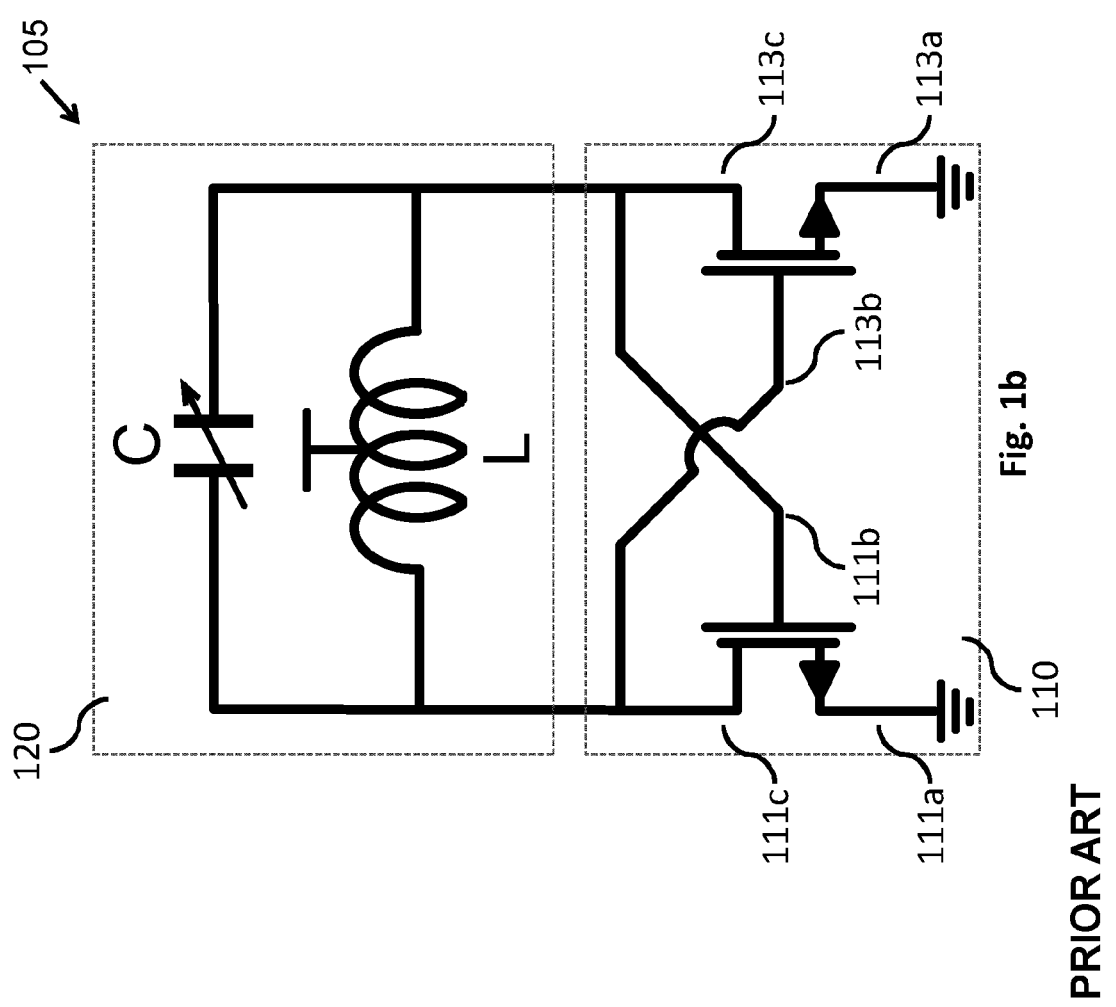
FIG. 1b is a schematic representation of an LC tank circuit incorporating an NMOS cross-coupled pair circuit according to the prior art.
Figure 1A:
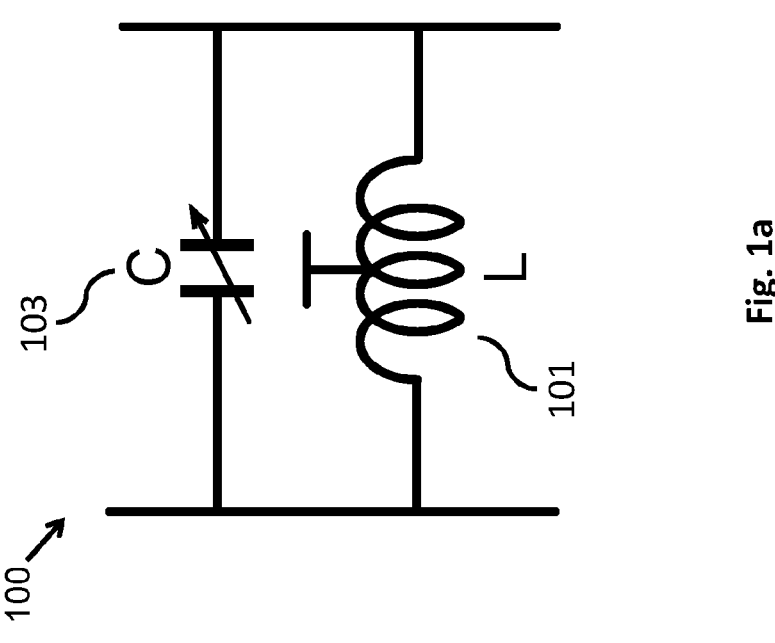
FIG. 1a is a schematic representation of an LC tank circuit according to the prior art.

FIG. 1 shows an LC tank circuit 100 comprising an inductor 101 and a capacitor 103. In such an LC tank circuit, if the capacitor 103 is initially charged, the voltage across the capacitor 103 drives a current through the inductor 101, causing a magnetic field to be generated around the inductor 101. As the charge stored within the capacitor 103 depletes as a result of the current flow through the inductor 101, the voltage across the capacitor 101 decreases until no voltage difference is present across the capacitor 103. At this point, the magnetic field around the inductor 101 generates an EMF across the inductor 101 with the opposite polarity to that initially present, causing a current to flow in the opposite direction, recharging the capacitor 103 with polarity opposite to that of its original state. The charged capacitor 103 then discharges across the inductor 101, and the process repeats at a characteristic resonant frequency, determined by the capacitance and inductance of the capacitor 103 and inductor 101 respectively. The resonant frequency of such a circuit is given by $\omega_0 = 1/\sqrt{LC}$. The repeated charging of the capacitor 103 and generation of a magnetic field around the inductor 101 therefore allows the LC tank circuit 100 to store energy and act as a harmonic oscillator, generating a signal at the resonant frequency $\omega_0$. LC tank circuits such as LC tank circuit 100 can therefore be used to generate sinusoidal signals at a resonant frequency $\omega_0$ defined by the capacitance and inductance of their components.

Due to the intrinsic impedance of the LC tank circuit 100, the amount of energy stored in the LC tank circuit 100 reduces over time as a result of resistive losses, damping the resonant behaviour. The severity of the decay in amplitude of oscillations within the LC tank circuit 100 is determined by the impedance of the LC tank circuit 100, i.e., in relation to the capacitance and inductance in the LC tank circuit 100. However, oscillations in the LC tank circuit 100 may be maintained if the resistive losses are removed, or if the LC tank circuit 100 is driven (i.e., energy is provided to the LC tank circuit 100) at or close to the resonant frequency $\omega_0$.

Whether or not oscillations are maintained in an LC tank circuit can be determined by the so-called "Barkhausen Criteria", which state that in a linear circuit with a feedback loop, steady state oscillations may be maintained as long as:

i) The absolute magnitude of the gain within the loop is equal to unity; and ii) The phase shift around the loop is zero or an integer multiple of $2\pi$.

Maintaining such criteria is therefore of critical importance in order to provide harmonic LC oscillators of stable frequency and amplitude.

To achieve a gain of unity or greater in an LC tank circuit, the intrinsic impedance within the LC tank circuit needs to be overcome. One method of achieving this is to introduce negative impedance components in the LC tank circuit to effectively cancel its intrinsic impedance, such that the LC tank circuit behaves more like a model LC oscillator in which oscillations are not damped.

A negative impedance may be introduced to the LC tank circuit using active components, such as transistors. Various arrangements of active components may be used to introduce a negative impedance to circuits to which they are connected. One approach is to introduce a "cross-coupled pair circuit", as shown in FIG. 1*b*.

FIG. 1*b* shows an LC oscillator circuit 105 comprising an LC tank circuit 120 connected to a cross-coupled pair circuit 110 comprising two NMOS transistors, 111 and 113, each having a source (111*a* and 113*a* respectively) connected to ground. The NMOS transistors 111 and 113 are arranged such that the gate 111*b* of the first transistor 111 is connected to the drain 113*c*, of the second transistor 113, and the gate 113*b* of the second transistor 113 is connected to the drain 111*c* of the first transistor 111. Connected in this way, the NMOS transistors 111, 113 together provide a source of negative impedance to the LC tank circuit 100. The impedance of the cross-coupled pair circuit 110 can be shown to be equal to $-2/g_m$ where $g_m$ is the transconductance of the NMOS transistors, i.e., the ratio of the drain current to the voltage across the gate-source terminals.

By appropriately selecting the properties of the NMOS transistors 111, 113 of the cross-coupled pair circuit 110 according to the impedance of the LC tank circuit 120 (i.e., such that the negative impedance they produce is approximately equal to the impedance of the LC tank circuit 120), the intrinsic impedance within the LC tank circuit 120 can be effectively cancelled, allowing a gain of unity or greater in the circuit to be achieved.

Figure 2B:
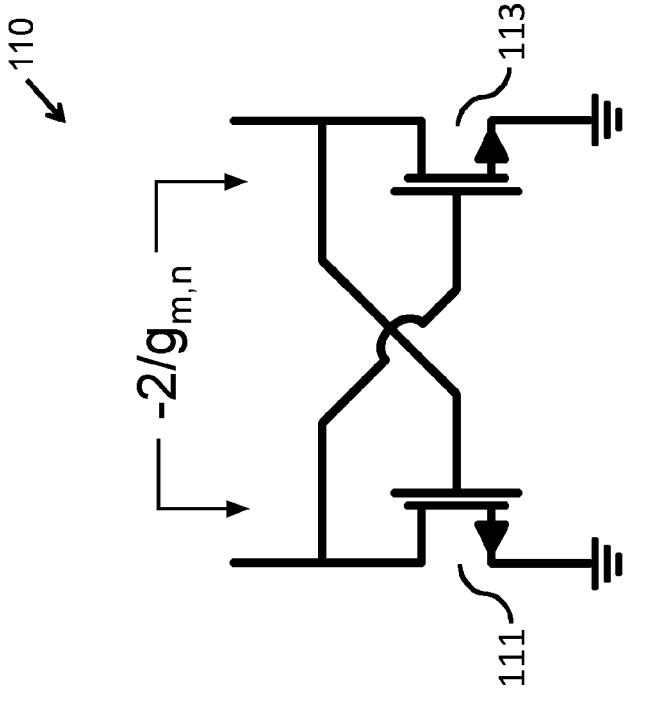
FIGS. 2a and 2b schematically illustrate PMOS-based and NMOS-based cross-coupled pair circuits according to the prior art.
Figure 2A:
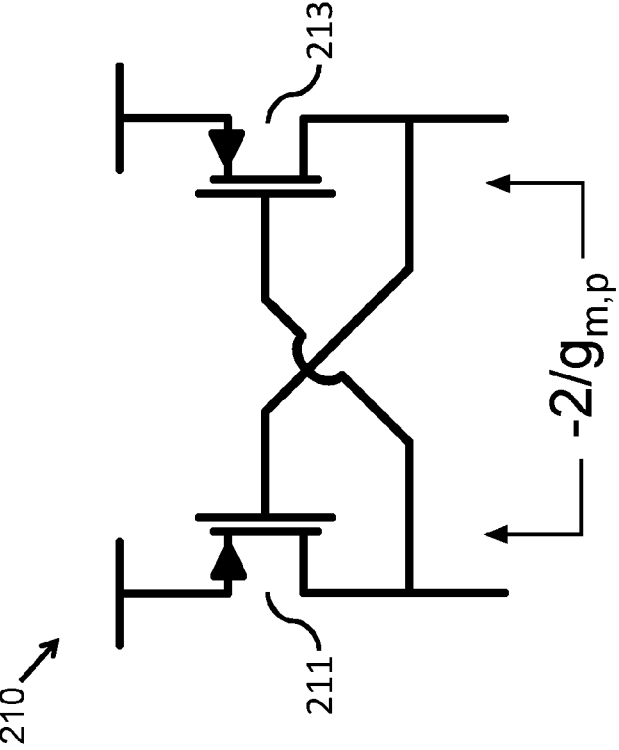

Although FIG. 1*b* shows a cross-coupled pair circuit 110 comprising NMOS transistors, the same effect may be achieved using PMOS transistors, as shown in FIG. 2*a*.

FIG. 2*a* shows a cross-coupled pair circuit arrangement 210 implemented using PMOS transistors 211, 213. For the purposes of comparison, FIG. 2*b* reproduces the cross-coupled pair circuit arrangement 110 shown in FIG. 1*b*, i.e., implemented using NMOS transistors 111, 113. Both cross-coupled pair circuits 110, 210 serve the same function, i.e., providing a negative impedance to a connected LC tank circuit as shown in FIG. 1*b*. However, the NMOS based circuit is generally preferred due to the majority charge carrier being electrons, and hence having a greater charge mobility.

It is also possible to introduce negative impedance to an LC tank circuit by providing both PMOS and NMOS cross-coupled pair circuits, situated upstream and downstream of an LC tank circuit respectively (i.e., closer to, and further from, a supply rail). An example of such a complementary cross-coupled oscillator circuit 300 can be seen in FIG. 3.

Figure 3:
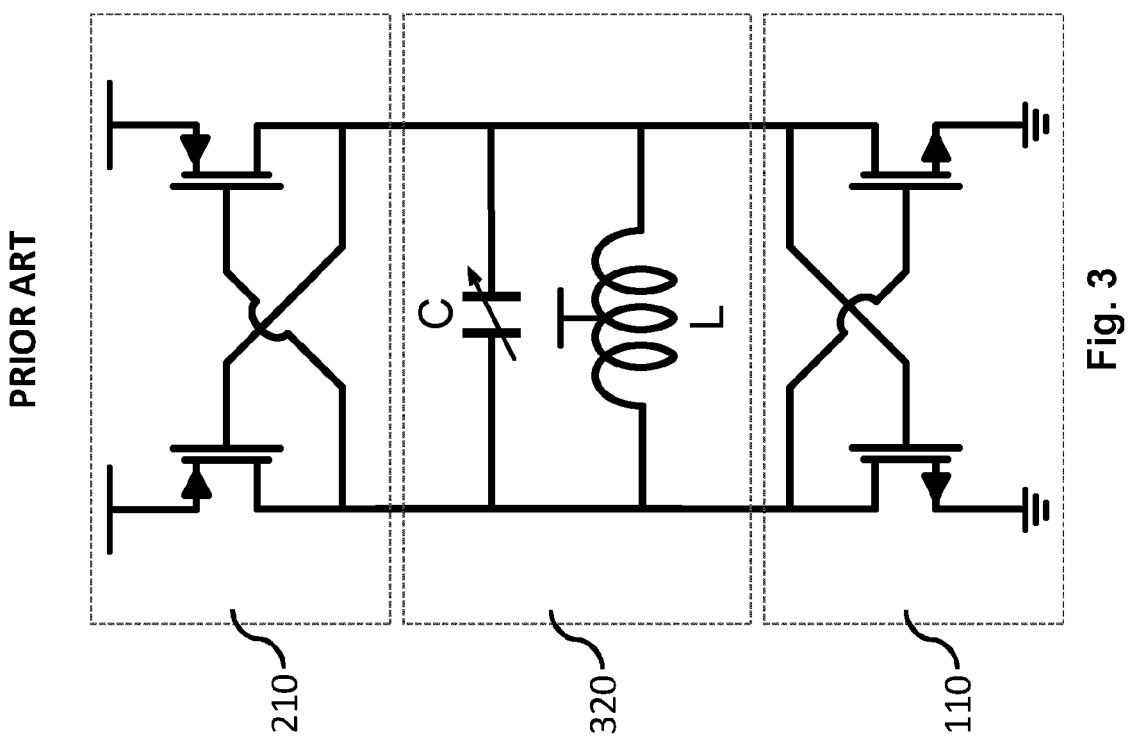
FIG. 3 shows a complementary (with NMOS and PMOS) cross-coupled oscillator circuit according to the prior art.

FIG. 3 shows a complementary cross-coupled oscillator circuit 300 comprising an LC tank circuit 320, an upstream PMOS cross-coupled pair circuit 210 as shown in FIG. 2*a*, and a downstream NMOS cross-coupled pair circuit 110 as shown in FIG. 2*b*. By connecting the PMOS cross-coupled pair circuit 210 and the NMOS cross-coupled pair circuit 110 upstream and downstream of LC tank circuit 320 respectively, a negative impedance can be introduced in the circuit in a more power efficient manner than with a single PMOS or NMOS cross-coupled circuit, while still allowing the intrinsic impedance within the circuit to be effectively cancelled.

By cancelling the intrinsic impendence of an LC tank circuit, LC oscillators comprising negative impedance components, such as those shown in FIGS. 1b to 3 are able to sustain oscillations at the resonant frequency of the LC tank circuit.

While the introduction of negative impedance components provides a first way in which to sustain oscillations in an LC tank circuit, this is not the only way that a gain of unity can be achieved in order to satisfy Barkhausen's criteria. A gain of unity or greater can also be achieved by driving the LC tank circuit, i.e., introducing energy to the LC tank circuit to sustain oscillations.

Energy may be introduced to the LC tank circuit using a feedback loop comprising an amplifier connected to an output of the LC tank circuit, such that a fraction of the output signal can be used to compensate for resistive losses in the LC tank circuit. In such an implementation, a small portion of an output signal of the LC tank circuit may be provided to the input of an amplifier, and the amplified signal can be fed back into the LC tank circuit. Amplifiers may therefore be used to provide positive feedback to an LC tank circuit in order to sustain oscillations within the circuit at its resonant frequency.

Figures 4A, 4B:
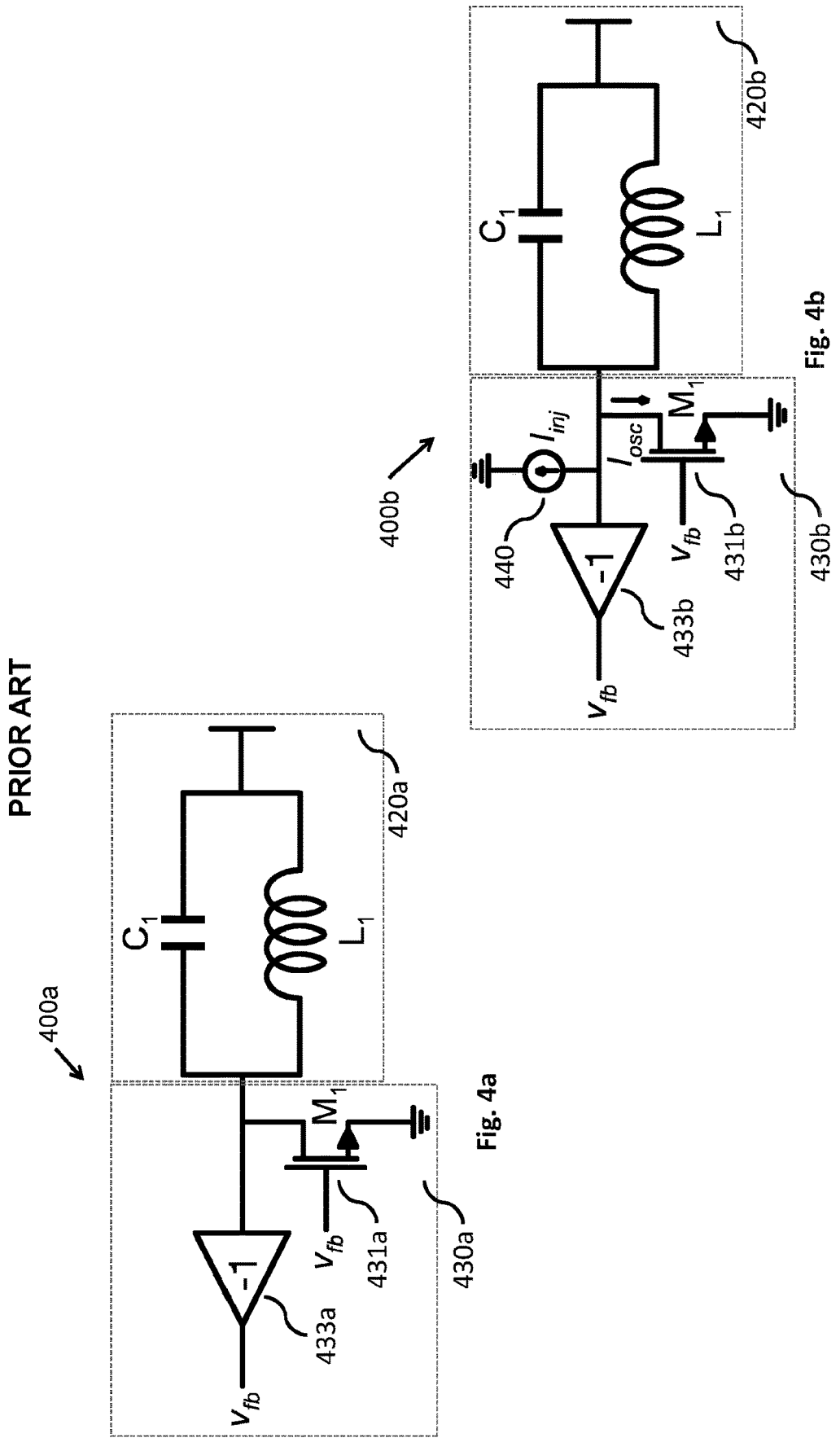
FIGS. 4a and 4b schematically illustrate an LC oscillator circuit comprising a feedback loop with and without current injection according to the prior art.

An example of this is provided in FIG. 4a, which shows an oscillator circuit 400a comprising an LC tank circuit 420a and a feedback loop 430a, the feedback loop 430a comprising an NMOS transistor 431a and an inverting amplifier 433a. It will be appreciated that the feedback loop 430a between the inverting amplifier 433a and the NMOS transistor 431a is made by connecting together the two connections labelled $V_{fb}$ (which are illustrated broken only for simplicity). In operation, when the oscillator circuit 400a is turned on initially, electronic noise in the circuit provides a non-zero signal to the inverting amplifier 433a. The noise travels around the LC tank circuit 420a generating a signal at the resonant frequency of the LC tank circuit 420a, which is repeatedly amplified by the inverting amplifier 433a and fed back to the LC tank circuit 420a, until a steady-state oscillating signal at the resonant frequency is achieved. The NMOS transistor 431a acts to provide a 180-degree phase shift in the feedback loop, which, combined with the phase shift of the inverting amplifier 433a, ensures that the total phase shift in the loop is zero. As the oscillator circuit 400a has a gain of unity or greater, and the phase shift is zero, Barkhausen's criteria are met and the oscillator circuit 400a is able to sustain oscillations at the resonant frequency of the LC tank circuit 420a.

Having outlined, with reference to FIGS. 1 to 4a, how negative impedance components or positive feedback loops may be implemented to sustain oscillations in an LC tank circuit at its resonant frequency, methods for controlling of the frequency of these oscillations are described in the following, with reference to FIGS. 4b to 11b.

As the resonant frequency of an LC tank circuit is determined based on its inductance and capacitance as $1/(2\pi \sqrt{LC})$, the resonant frequency of the LC tank circuit is generally controllable by selecting appropriate capacitors (e.g., using variable capacitors, i.e., varactors, or switched capacitor banks) and inductors that provide a desired resonant frequency. However, it may not always be possible to achieve an arbitrary resonant frequency by selecting appropriate capacitors and inductors while still achieving a sufficiently high quality factor.

In such instances, an LC oscillator can be 'forced' to oscillate at a frequency different than, but close to, its resonant frequency, by taking advantage of a phenomenon known as injection locking, as will be described below. This may be useful where, for example, an inductor and capacitor with a high quality factor allow a circuit to be fabricated with a resonant frequency close to, but not precisely at, a required operating frequency of another part of a larger circuit.

For example, if part of a circuit comprising an LC oscillator requires an input signal at a predetermined frequency, e.g., 5.0 GHz, and selection of a high-Q capacitor and an inductor provides an LC tank circuit with resonant frequency 5.1 GHz, the LC tank circuit can be forced to oscillate at 5.0 GHz by making use of injection locking.

Injection locking occurs when a first oscillator, oscillating at a first frequency, is disturbed by a second oscillator oscillating at a nearby frequency. When there is a strong coupling between the first and second oscillators, and the first and second frequencies are sufficiently close, the first oscillator may be 'pulled' by the second oscillator, and its frequency of oscillation may become effectively identical to that of the second oscillator.

In the context of an LC tank circuit, a second oscillating signal may be provided by introducing a current into the LC tank circuit at a predetermined frequency, close to the natural resonant frequency of the LC tank circuit.

An example of an oscillator circuit including current injection is provided in FIG. 4b, which shows an oscillating circuit 400b comprising an LC tank circuit 420b and a feedback loop 430b, the feedback loop 430b comprising an NMOS transistor 431b and an inverting amplifier 433b, equivalent to that shown in FIG. 4a. As in FIG. 4a, the feedback loop 430b between the inverting amplifier 433b and the NMOS transistor 431b is represented in FIG. 4b by the two connections labelled $V_{fb}$ which are to be connected together. As in FIG. 4a, the NMOS transistor 431b provides a 180-degree phase shift in the feedback loop (to provide a $2\pi$ phase shift in total in the loop) to ensure that Barkhausen's criteria are met. The oscillator circuit 400b also includes an injected current source 440, which serves to provide an injection of a sinusoidal current $I_{inj}$ at a frequency $\omega_{inj}$ to the drain of the NMOS transistor 431b.

The effect of the injection of a current $I_{inj}$ into an LC oscillator circuit depends on the phase relationship between the injected current $I_{inj}$ and the oscillations of the LC tank circuit 420b.

If there is no phase difference between the injected current $I_{inj}$ and the oscillation of the LC tank circuit 420b, then the LC oscillator 400b will continue to oscillate at the resonant frequency of the LC tank circuit 420b, albeit with an increased amplitude in the absence of any limiter. However, if the current injection is not exactly in phase with the oscillations of the LC tank circuit 420b, a phase shift is introduced in the LC tank circuit 420b, e.g., a shift of $\phi$ radians.

Following the introduction of a phase shift, according to the Barkhausen criterion ii) described above, steady state oscillations cannot be maintained, as the total phase shift in the loop is no longer equal to 0 or $2\pi$. The non-zero phase shift therefore brings about a change in the frequency of oscillations of the LC tank circuit 420b from $\omega_0$ to a new value $\omega_1$ to compensate for the phase shift in the LC tank circuit 420b such that the tank contributes a respective phase shift to cancel the effect of the phase shift $\phi$.

Depending on the amplitude and frequency $\omega_{inj}$ of the injected current $I_{inj}$, injection locking of the LC tank circuit 420b can occur, and the oscillating circuit 400b can be made to oscillate at a frequency $\omega_1 = \omega_{inj}$ equal to that of the injected current rather than the natural resonant frequency $\omega_0$ of the LC tank circuit. In this way, an injection current may be used to bring about a change in the frequency of an LC tank circuit such as LC tank circuit 420b.

Whether or not injection locking occurs depends on the locking range, i.e., the range of $\omega_{inj}$ across which injection locking holds. The maximum locking range can be given by:

$$\omega_0 - \omega_{inj} \approx \frac{\omega_0}{2Q} \cdot \frac{I_{inj}}{I_{osc}},$$

where $I_{osc}$ is the oscillator current, e.g., the drain current of the NMOS transistor 431$b$ in FIG. 4$b$.

Thus, by selecting $I_{inj}$ and $\omega_{inj}$ appropriately, an oscillator including an LC tank circuit can be made to oscillate at a desired frequency $\omega_1 = \omega_{inj}$ close to the resonant frequency $\omega_0$ of the LC tank circuit.

Figure 5:
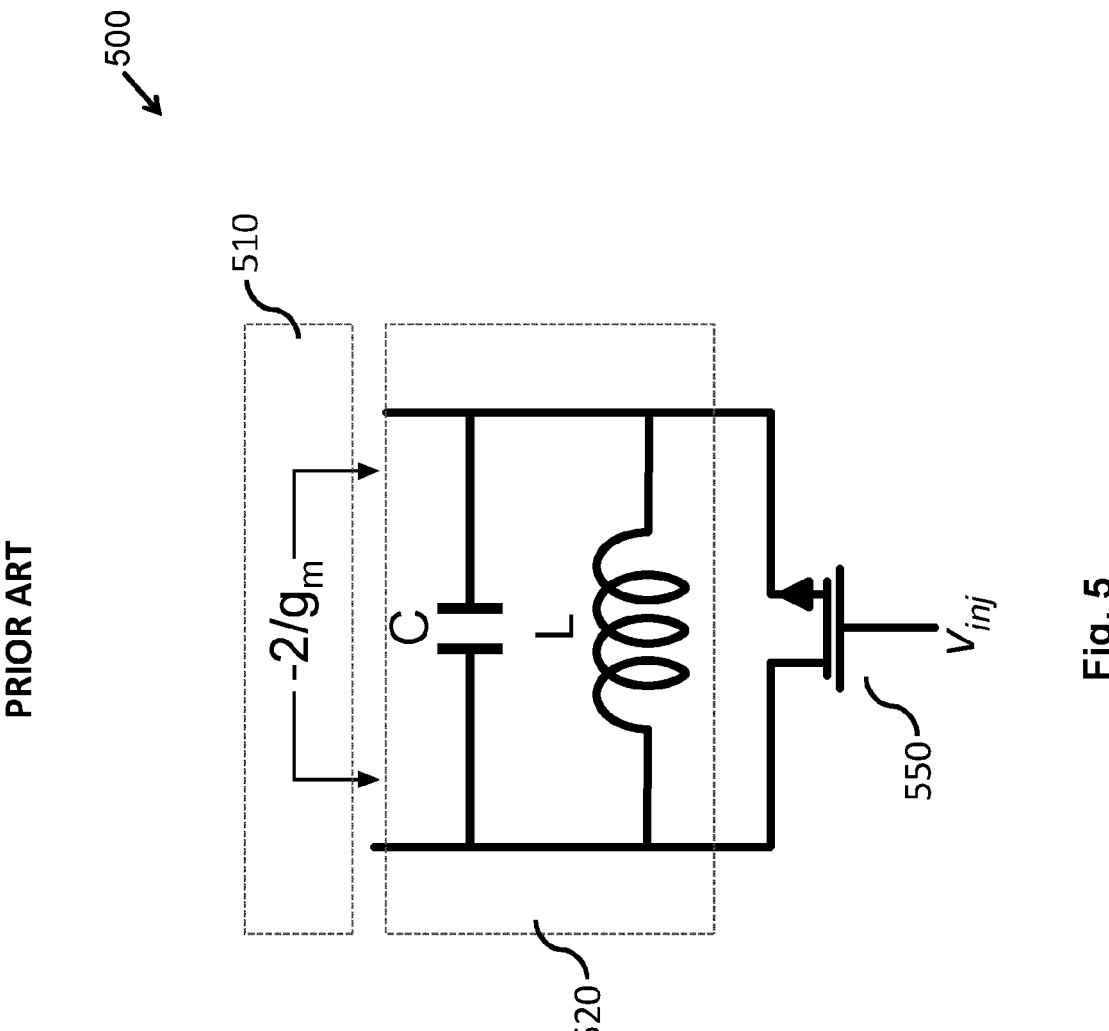
FIG. 5 is a schematic representation of an injection-locked oscillator according to the prior art.

FIG. 5 shows an injection-locked oscillator according to the prior art. The injection-locked oscillator 500 comprises a cross-coupled pair circuit 510 (not shown in detail, but represented as $-2/g_m$) connected to an LC tank circuit 520, and a current injection source in the form of a transistor 550. The gate of the transistor 550 is connected to the injection source that is arranged to receive an injection signal from a clock source at a frequency $\omega_{inj}$. The application of a voltage at the gate of the transistor 550 causes the current of the LC tank circuit 520 to flow through the transistor 550, introducing a signal into the LC tank circuit 520 at a frequency $\omega_{inj}$ set by an injection clock source (not shown) connected to the gate of the transistor 550. This process effectively shorts the LC tank circuit 520 for a brief period at the frequency $\omega_{inj}$, removing energy from the LC tank circuit 520 while introducing a phase difference into the LC tank circuit 520. This phase difference brings about a change in the frequency of the LC tank circuit 520 from the resonant frequency $\omega_0$ to a new frequency set by the clock signal as $\omega_1 = \omega_{inj}$.

An advantage to 'shorting' (i.e., applying phase correction) over injecting current is that it minimizes disturbance to the oscillator amplitude and the oscillator phase will be pushed towards the zero crossing. For a non 50% duty-cycle injection signal, the injection signal is usually a stream of very narrow pulses whereby the phase correction is usually realized at the beginning/end of each cycle. This also minimizes unnecessary current consumption.

It is known that current injection at a frequency lower than that of the injection-locked frequency would be beneficial. One way to achieve this is to inject current at a lower frequency than the resonant frequency of the LC tank circuit, but having a harmonic component at the desired locking frequency.

For example, for an LC tank circuit with a natural resonant frequency of 5.1 GHz, an injected signal at 1 GHz can, in principle, be used to lock the frequency of the LC tank circuit to a frequency of 5 GHz, i.e., to the fifth harmonic of the 1 GHz signal. By relying on a harmonic rather than the injection frequency, a low frequency clock source can be used to cause an LC tank circuit to be injection locked to a significantly higher frequency. In other words, the LC tank circuit can be forced to oscillate at a frequency $\omega_1$ that is a multiple, N, of the frequency of the injection current, i.e., $\omega_1 = N\omega_{inj}$, and hence allow greater flexibility in the selection of clock source, e.g., allowing a clock source requiring less power to be used.

If a stable, low frequency clock signal having an $N^{th}$ harmonic close to a desired injection locked frequency is used, the frequency of the oscillating signal in the LC tank circuit 520 can be compensated once every N cycles of the oscillating signal at the natural resonant frequency using an injection signal. The injection signal 'pulls' the oscillating signal in the LC tank circuit 520 to the frequency of the Nth harmonic of the clock signal once every N cycles.

For example, if an injection signal at 1 GHz is used to lock the frequency of the LC tank circuit having a natural resonant frequency of 5.1 GHz to an injection-locked frequency of 5 GHz, i.e., to the fifth harmonic of the 1 GHz signal, current injection will only occur once every five cycles of the LC tank signal. If the natural frequency of the LC tank is not exactly at the fifth harmonic of the injection signal, the pulse width of the four cycles preceding the injection pulse (i.e., the $5^{th}$ cycle) will be different. The LC tank signal is thus 'pulled' (i.e., $5^{th}$ pulse is made shorter or longer) in response to the injection signal, causing the signal in the LC tank circuit 520 to lock to the Nth harmonic frequency, i.e., to 5 GHz in this case. Phase correction forces the average frequency to be equal to that of the injection frequency, i.e., when locked, the injection-locked oscillator has a zero average frequency error.

A lower frequency injection signal can therefore be used to cause injection locking at one of its higher frequency harmonics. This may enable lower frequency clock sources to be employed while still allowing generation of high frequency signals in the LC tank circuit. Examples of such circuits will now be described with reference to FIGS. 6 to 10.

Figure 6:
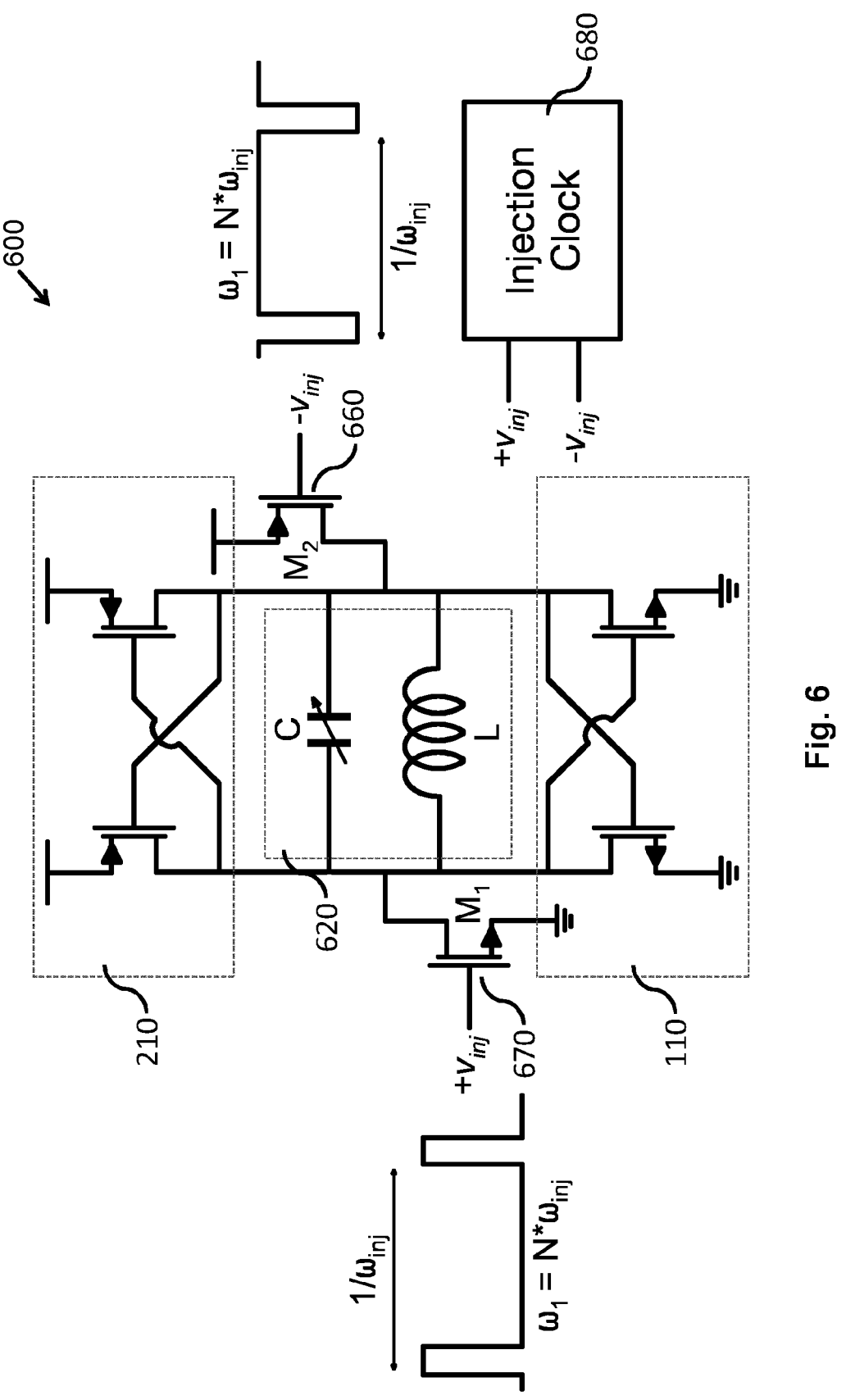
FIG. 6 is a schematic representation of an injection-locked oscillator according to an embodiment of the present invention.

FIG. 6 shows an injection locked oscillator 600 according to an embodiment of the present disclosure. The injection locked oscillator 600 comprises an LC tank circuit 620, an upstream PMOS cross-coupled pair circuit 210 as shown in FIG. 2$a$, and a downstream NMOS cross-coupled pair circuit 110 as shown in FIG. 2$b$.

In contrast to prior art oscillator circuits, such as the complementary cross-coupled oscillator circuit 300 shown in FIG. 3, the injection locked oscillator 600 also comprises two current controllers in the form of a PMOS transistor 660 and an NMOS transistor 670, connected across the LC tank circuit 620. Specifically, the PMOS transistor 660 is connected to a first side of the LC tank circuit 620 (i.e., corresponding to a first terminal of the inductor and capacitor) and the NMOS transistor 670 is connected to a second side of the LC tank circuit 620 (i.e., corresponding to a second terminal of the inductor and capacitor).

The PMOS transistor 660 and the NMOS transistor 670 are connected to a clock source 680, configured to apply a negative voltage $-V_{inj}$ to the gate of the PMOS transistor, and a positive voltage $+V_{inj}$ to the gate of the NMOS transistor, at an injection frequency $\omega_{inj}$ having an Nth harmonic $\omega_1$ close to the resonant frequency $\omega_0$ of the LC tank circuit 620. The clock source 680 is configured to apply an injection signal in the form of a stream of pulses. The pulses are preferably narrow in the time domain, e.g., with a pulse width in the order of 100 ps, or in some embodiments, no more than 50 picoseconds. The width of these pulses may alternatively be defined as a duty cycle of no more than 10%, or in some embodiments no more than 5% of the injection signal.

The injection locked oscillator 600 can be made to oscillate at the resonant frequency $\omega_0$ of the LC tank circuit 620, which is sustained as a result of the negative impedance within the circuit due to the cross-coupled pair circuits 110 and 210 as described above. With appropriate injection of current through the LC tank circuit 620, the injection locked oscillator 600 can also be made to oscillate at the frequency $\omega_1$ by injection locking to an injected current signal.

In the injection locked oscillator 600 shown in FIG. 6, current injection is performed using both the PMOS transistor 660 and the NMOS transistor 670 as will be described in the following. It will be appreciated that injection locking in the injection locked oscillator 600 is performed with a low injection frequency $\omega_{inj}$ having an Nth harmonic at $\omega_1$, rather than at the frequency $\omega_1$.

Injection at the frequency $\omega_1$ is performed using the injection clock source 680, which outputs an extremely short duration (of the order of tens of picoseconds, e.g., no more than 100 ps or no more than 50 ps) voltage pulse to both the PMOS transistor 660 and the NMOS transistor 670 simultaneously at $\omega_{inj}$. This causes voltages of opposite polarity at the gates of the PMOS transistor 660 and the NMOS transistor 670 for the duration of the pulse. While the voltage is applied at the gates of the PMOS transistor 660 and the NMOS transistor 670, a current flows from the PMOS transistor 660 to the NMOS transistor 570 through the LC tank circuit 620. In this way, a current is injected across the LC tank circuit at the frequency $\omega_{inj}=\omega_1/N$.

Unlike in typical injection locked oscillators, such as the injection locked oscillator 500 shown in FIG. 5, the injection of current in the injection locked oscillator 600 is not simply through shorting the LC tank circuit to remove energy. Rather, current (and energy) is introduced into the circuit from the PMOS transistor 660, and then flows out of the circuit through the NMOS transistor 670.

As the frequency of injection is approximately N times lower than the resonant frequency of the LC tank circuit 620, injection of current occurs only once every N cycles of the oscillating signal in the LC tank circuit 620. In the N–1 cycles following each current injection, the phase of the oscillations in the LC tank circuit 620 may drift away from that of $\omega_1$ (i.e., the Nth harmonic of the signal injected at $\omega_{inj}$. This causes the frequency of oscillations in the LC tank circuit 620 to drift between injection pulses. Every N cycles of $\omega_1$, the current injection at $\omega_{inj}$ 'pulls' the frequency of oscillations of the LC tank circuit 620 to the frequency of the Nth harmonic, correcting for any drift that may have occurred in the previous N–1 cycles, and maintaining oscillation at the frequency $\omega_1$.

This is achieved in the injection locked oscillator 600 by applying a current spike of extremely short duration (of the order of tens of picoseconds) in the time domain each time an injected current is applied, i.e., at a rate set by the injection clock 680. This short pulse in time is equivalent to a broadband signal in the frequency domain. Thus, by appropriately controlling the width of the pulse in the time domain (e.g., by providing a sufficiently narrow pulse in the time domain) a frequency domain signal may be generated having components over a wide range of frequencies, including a component at the Nth harmonic $\omega_1$ close to the resonant frequency $\omega_0$ to which the signal in the LC tank circuit 620 can be locked. The pulse width of the injection pulses determines the strength of the Nth harmonic, and hence by applying a sufficiently short pulse, a strong injection signal at the Nth harmonic may be generated, allowing injection locking to take place.

Specifically, each time a current injection is provided, current flowing into the circuit from the source at the PMOS transistor causes the peaks of the oscillating signal to be corrected, by 'pulling' them up to the peaks of the signal at the harmonic $\omega_1$ of the current injected at win. Similarly, the current flowing out of the circuit to the sink at the NMOS transistor causes the troughs of the oscillating signal to be corrected, by 'pulling' them down to the troughs of the signal at the harmonic $\omega_1$ of the current injected at $\omega_{inj}$. Thus, the oscillating signal in the LC tank circuit 620 is corrected each time the current pulse is provided, such that the frequency of oscillations of the LC tank circuit 620 matches that of the Nth harmonic $\omega_1$ of the injected signal regardless of the phase of the oscillating signal in the LC tank 620 at the time at which the current is injected. By 'correcting' the oscillating signal in the LC tank circuit at the peaks and troughs of the oscillating signal, rather than shorting at the zero-crossings, as in the prior art, greater control is provided over the amount of energy that can be injected into the LC tank circuit. The achievable locking range is therefore increased in comparison to the prior art.

In this way, the injection locked oscillator 600 can be forced to oscillate at a predetermined frequency $\omega_1$ close to the resonant frequency $\omega_0$ of the LC tank 620 using injection of current at a significantly lower frequency $\omega_{inj}$ in the injection locked oscillator 600.

Figure 7:
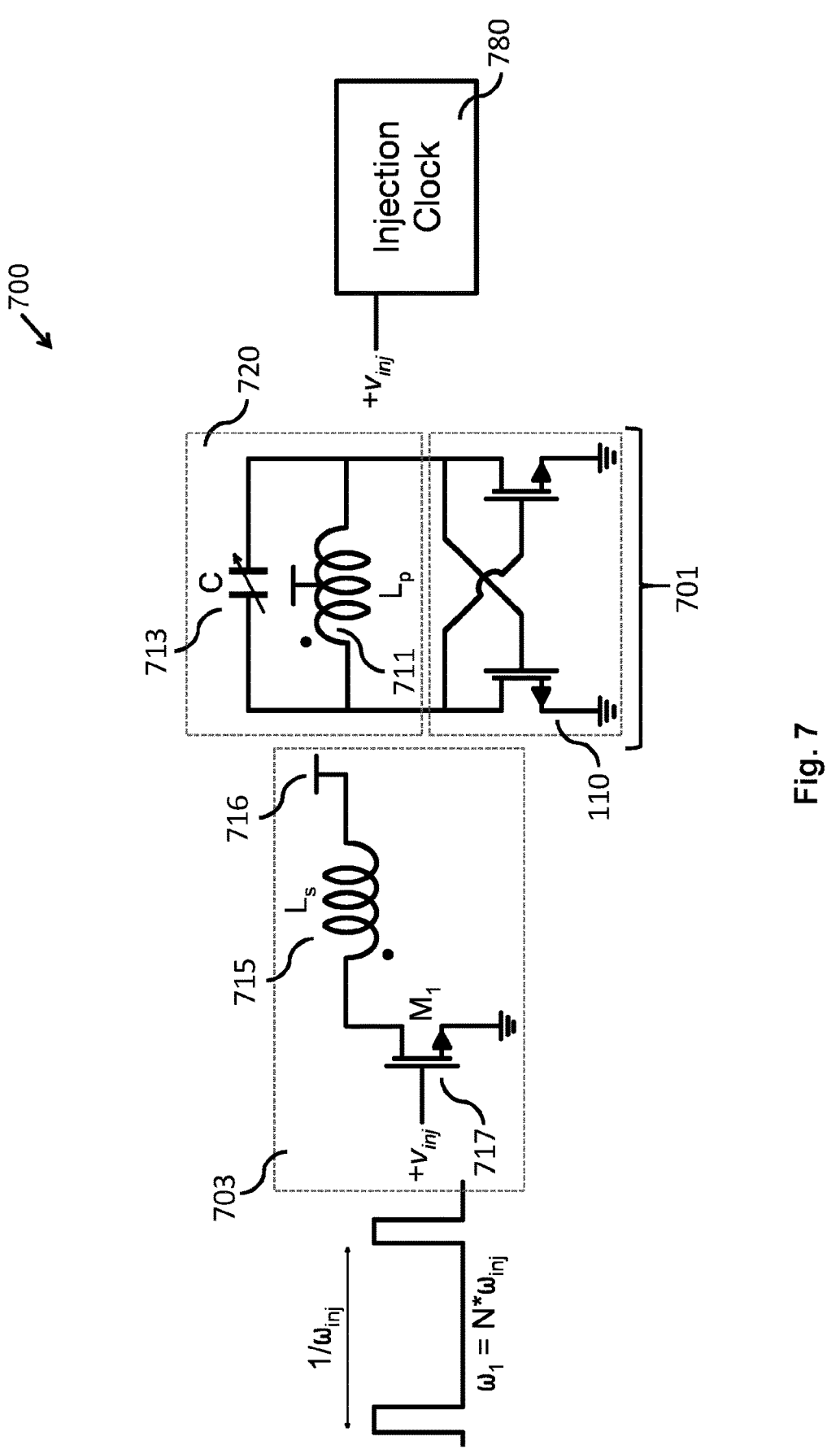
FIG. 7 is a schematic representation of an injection-locked oscillator according to an embodiment of the present invention.

FIG. 7 shows an injection locked oscillator 700 according to a second embodiment of the present invention.

The injection locked oscillator 700 comprises two electrically separated circuits: an oscillator circuit 701 and an injection circuit 703. The oscillator circuit 701 comprises an LC tank circuit 720 comprising an inductor in the form of a first inductive winding 711, a capacitor 713 and a downstream NMOS cross-coupled pair circuit 110, as shown in FIG. 2b. The circuits 701, 703 are electrically separated in the sense that current does not flow directly from one to the other.

In a manner equivalent to that described above in relation to FIGS. 1 to 6, the oscillator circuit 701 may be used to generate a periodic signal at a resonant frequency $\omega_0$ defined by the capacitance of the capacitor 713 and the inductance of the first inductive winding 711. The NMOS cross-coupled pair circuit 110 serves to provide a negative impedance in the oscillator circuit 701 that effectively cancels the intrinsic impedance within the LC tank circuit 720, allowing a gain of unity or greater in the oscillator circuit 701 to be achieved, and hence reducing damping of oscillations in the LC tank circuit 720.

As described in relation to FIG. 6, with appropriate injection of current through the LC tank circuit 720, the oscillator circuit 701 can also be made to oscillate at a frequency $\omega_1$ close to the resonant frequency $\omega_0$ by forcing it to become injection locked to an injected current signal at (or having a harmonic at) $\omega_1$.

In the injection locked oscillator 700, injection of current into the oscillator circuit 701 is performed using the injection circuit 703, which is electrically separated from the oscillator circuit 701. Injection of current using a circuit that is electrically separated from the oscillator circuit 701 advantageously reduces parasitic capacitance in the LC tank circuits oscillator circuit 701.

The injection circuit 703 comprises a second inductive winding 715 and an NMOS transistor 717. The second inductive winding 715 is connected to a power supply rail 716 and to the NMOS transistor 717. The NMOS transistor 717 is connected to ground, and to an injection clock source 780, configured to apply a voltage $V_{inj}$ to the gate of the NMOS transistor 717 at an injection frequency $\omega_{inj}$ having an $N^{th}$ harmonic at a frequency $\omega_1$ close to the resonant frequency $\omega_0$ of the LC tank circuit 720.

When the voltage $V_{inj}$ is applied to the gate of the NMOS transistor 717, a current flows from the power supply rail 716 through to ground through the second inductive winding 715 and the NMOS transistor 717. A current is therefore introduced in the second inductive winding 715 at a frequency $\omega_{inj}$ having an Nth harmonic at a frequency $W_1$.

Although the injection circuit 703 and the oscillator 701 are electrically separated in the sense that no current flows between them directly, the first inductive winding 711 and the second inductive winding 715 are arranged such that they are electromagnetically coupled. The first inductive winding 711 and the second inductive winding 715 are therefore arranged such that they form the primary and secondary windings of a transformer respectively. In this way, the injection current in the second inductive winding 715 causes a corresponding current to be induced in the first inductive winding 711, the induced current also having a frequency $\omega_{inj}$.

An induced injected current therefore flows through the LC tank circuit 720 at a frequency $\omega_{inj}$ having an $N^{th}$ harmonic at a frequency $\omega_1$ close to the resonant frequency $\omega_0$ of the LC tank circuit 720. This causes oscillations in the LC tank circuit 720 to become injection locked in response to the injected current, such that the frequency of oscillations in the LC tank circuit is 'pulled' to the frequency of the $N^{th}$ harmonic, i.e., such that oscillations in the LC tank circuit 720 occur at $\omega_1$ rather than $\omega_0$. However, as described in relation to FIG. 6, as the frequency of injection is approximately N times lower than the resonant frequency of the LC tank circuit 720, injection of current occurs only once every N cycles of the oscillating signal in the LC tank circuit 720 at the frequency $\omega_1$.

In the time between current injections, the phase of the oscillations in the LC tank circuit 720 may therefore drift away from that of $\omega_1$ (i.e., the $N^{th}$ harmonic of the signal injected at $\omega_{inj}$). The frequency of oscillations in the LC tank circuit 720 may drift between injection pulses, and must be overcome with each injection of current in order to sustain oscillation at the frequency $\omega_1$. As described in relation to the injection locked oscillator 600 shown in FIG. 6, this is achieved by applying a current spike of extremely short duration (of the order of tens of picoseconds) in the time domain (equivalent to a broadband signal in the frequency domain) each time an injected current is applied.

As the broadband signal in the frequency domain contains components over a wide range of frequencies, including a component at the $N^{th}$ harmonic frequency $\omega_1$ close to the resonant frequency $\omega_0$, the oscillating signal in the LC tank circuit 720 is 'pulled' to the frequency of the $N^{th}$ harmonic each time it locks to the component of the signal at the frequency $\omega_1$, regardless of the phase of the oscillating signal in the LC tank circuit 720 at the time at which the current is injected.

Thus, the oscillating circuit 701 of the injection locked oscillator 700 can be forced to oscillate at a predetermined frequency $\omega_1$ close to the resonant frequency $\omega_0$ of the LC tank circuit 720 using injection of current at a significantly lower frequency $\omega_{inj}$ in the injection circuit 703.

Although the injection circuit 713 of FIG. 7 is shown with an inductive winding connected between a power supply rail 716 and an NMOS transistor, it will be appreciated that the injection circuit could equivalently comprise an inductive winding with a first terminal connected to ground and a second terminal connected to a PMOS transistor connected to a power supply rail 816 and configured to receive a voltage $-V_{inj}$ from the injection clock source 780.

Figure 8:
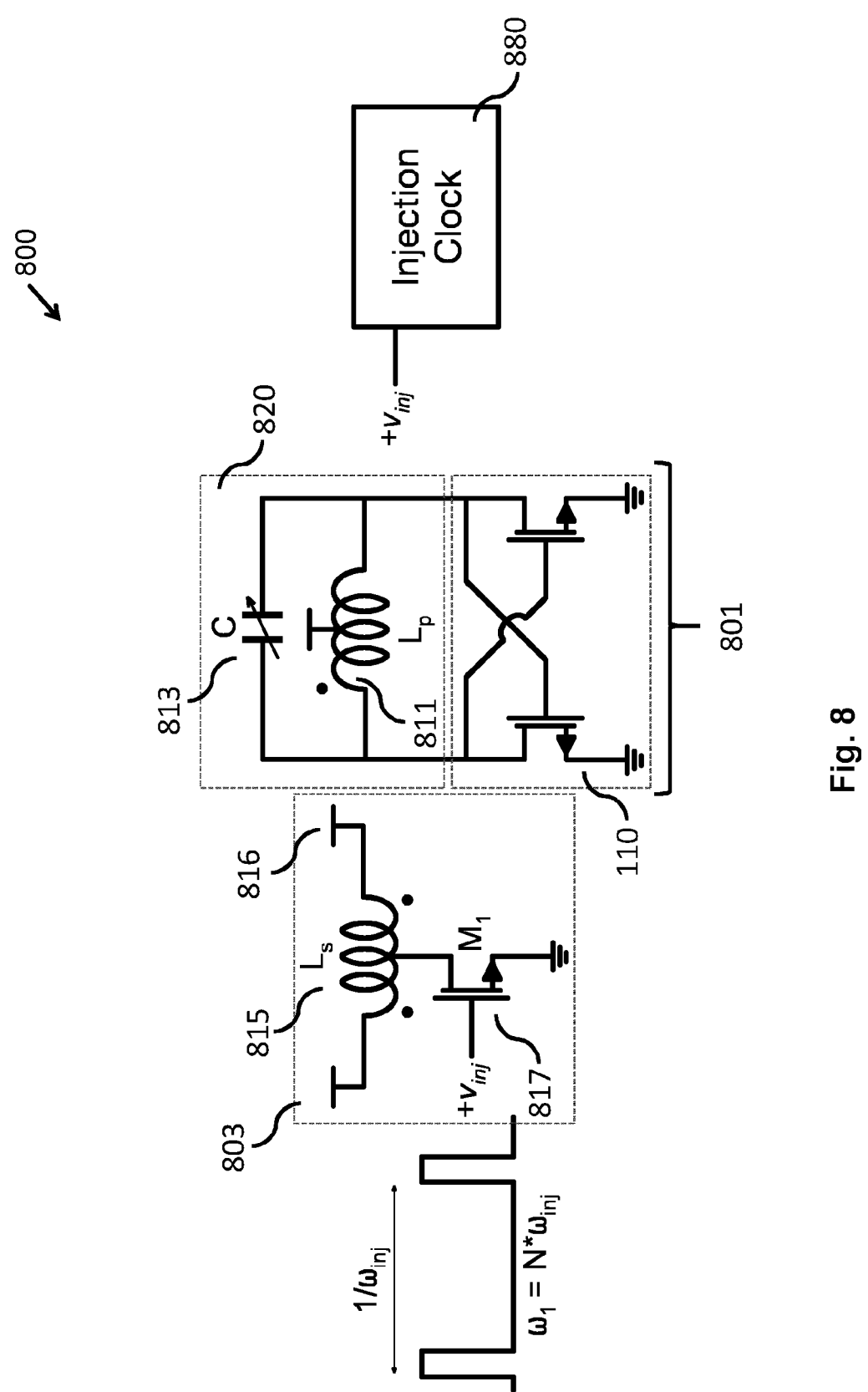
FIG. 8 is a schematic representation of an injection-locked oscillator according to an embodiment of the present invention.

In some preferred embodiments, the inductive winding shown in FIG. 7, and comprising two terminals connected between a power supply rail 716 and an NMOS transistor respectively, may be replaced by a three-terminal inductor, i.e., a centre tapped inductor, as shown in FIG. 8.

FIG. 8 shows an injection locked oscillator 800 in which an injection circuit 803 may be used to inject current into a first inductive winding 811 of an oscillator circuit 801. The injection circuit 803 comprises a second inductive winding

815 and an NMOS transistor 817. In contrast to FIG. 7, the second inductive winding 815 has three terminals: first and second terminals at the end-points of the second inductive winding 815, connected to a power supply rail 816, and a third terminal in the form of a centre tap at the mid-point of the second inductive winding 815, connected to the NMOS transistor 817.

The NMOS transistor 817 is connected to ground, and to a clock source 880, configured to apply a voltage $V_{inj}$ to the gate of the NMOS transistor 817 at an injection frequency $\omega_{inj}$ having an $N^{th}$ harmonic at a frequency $\omega_1$ close to the resonant frequency $\omega_0$ of the LC tank circuit 820.

When the voltage $V_{inj}$ is applied to the gate of the NMOS transistor 817, a current flows from the a power supply rail 816 through to ground through the second inductive winding 815 and the NMOS transistor 817. A current is therefore introduced in the second inductive winding 815 at a frequency $\omega_{inj}$ having an Nth harmonic at a frequency $\omega_1$.

In a manner equivalent to that described above in relation to FIG. 7, the first inductive winding 811 and the second inductive winding 815 are arranged such that they form the primary and secondary windings of a transformer respectively. In this way, the current in the second inductive winding 815 causes a corresponding current to be induced in the first inductive winding 811, the induced current also having a frequency $\omega_{inj}$.

Although FIG. 8 shows the injection circuit 803 using an NMOS transistor, the injection circuit 803 can also be implemented by using a PMOS transistor with its source connected to the power supply rail 816, and connecting the first and second terminals of the second inductor to ground. An example of such a system is illustrated in FIG. 9.

Figure 9:
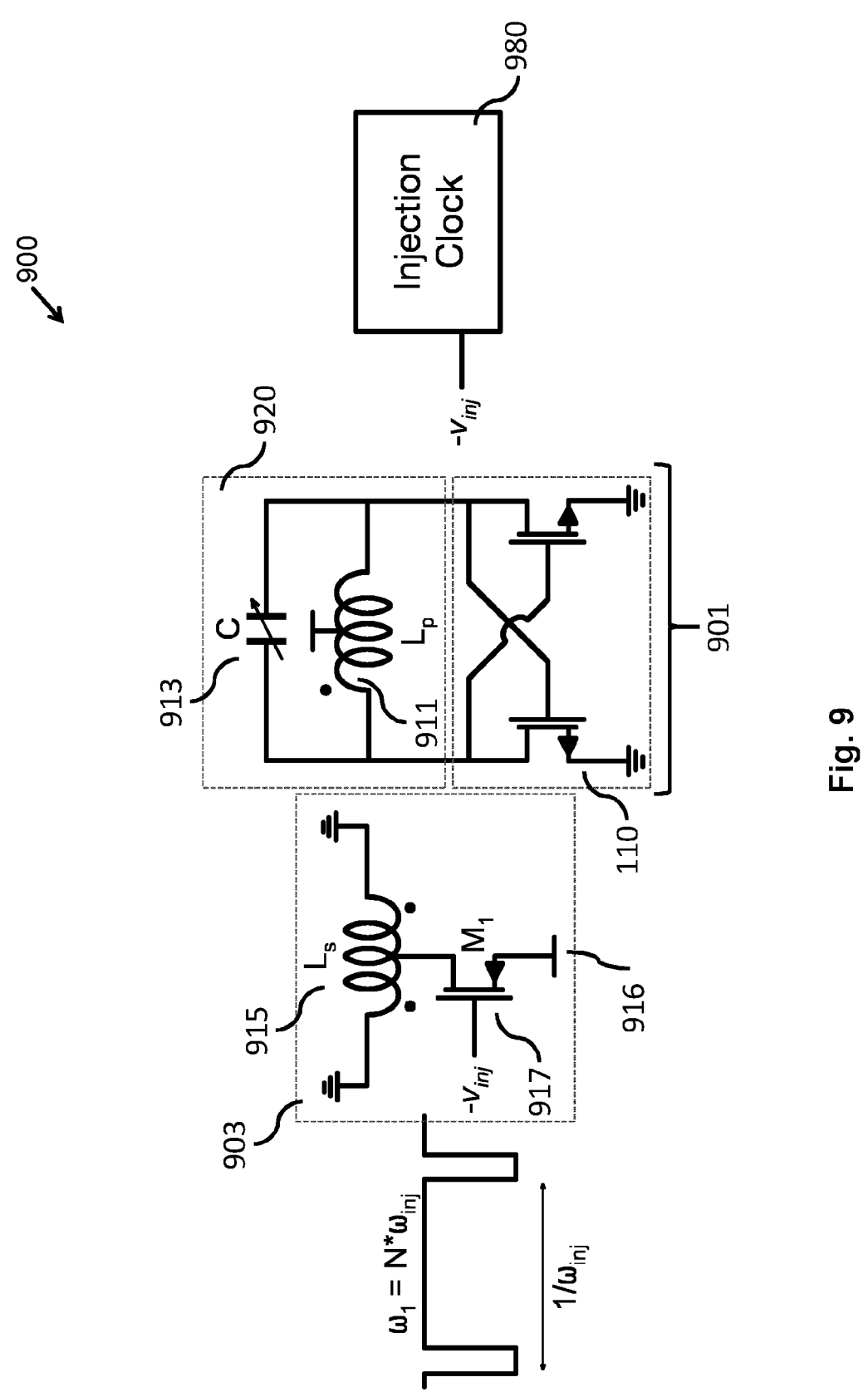
FIG. 9 is a schematic representation of an injection-locked oscillator according to an embodiment of the present invention.

FIG. 9 shows an injection-locked oscillator 900 according to an embodiment of the present invention. The injection-locked oscillator 900 comprises two electrically separated circuits: an oscillator circuit 901 and an injection circuit 903. The oscillator circuit 901 comprises an LC tank circuit 920 comprising a first inductor in the form of an inductive winding 911, a capacitor 913 and a downstream NMOS cross-coupled pair circuit 110 as shown in FIG. 2b.

The oscillator circuit 901 may be used to generate a periodic signal at a resonant frequency $\omega_0$ defined by the capacitance of the capacitor 913 and the inductance of the first inductive winding 911. The NMOS cross-coupled pair circuit serves to provide a negative impedance in the oscillator circuit 901, reducing damping of oscillations in the LC tank circuit 920 as described above.

Injection of current into the oscillator circuit is performed using the injection circuit 903. The injection circuit 903 comprises a second inductive winding 915 and a PMOS transistor 917. The second inductive winding 915 has three terminals: first and second terminals at the end-points of the inductive winding 915, both connected to ground, and a third terminal in the form of a centre-tap at the mid-point of the second inductive winding 915, connected to the drain of the PMOS transistor 917. The source of the PMOS transistor 917 is connected to a power supply rail 916, and the gate of the PMOS transistor 917 is connected to an injection clock source 980, configured to apply a voltage $-V_{inj}$ at an injection frequency $\omega_{inj}$ having an $N^{th}$ harmonic at a frequency $\omega_1$ close to the resonant frequency $\omega_0$ of the LC tank circuit 920.

When the voltage $-V_{inj}$ is applied to the gate of the PMOS transistor 917, current flows from the PMOS transistor 917 through the second inductive winding 815 at a frequency $\omega_{inj}$.

In a manner equivalent to that described in relation to FIG. 8, the first inductive winding 911 and the second inductive winding 915 are mutually coupled and arranged such that they form the primary and secondary windings of a transformer respectively. In this way, the current in the second inductive winding 915 induces a corresponding current in the first inductive winding 911 at a frequency $\omega_{inj}$. An injected current is therefore introduced in the LC tank circuit 920 at a frequency $\omega_{inj}$ having an $N^{th}$ harmonic at a frequency $\omega_1$ close to the resonant frequency $\omega_0$ of the LC tank circuit 920. Given sufficient locking range, this causes oscillations in the LC tank circuit 920 to become injection-locked at the frequency $\omega_1$.

As described above in relation to FIG. 8, the injected current introduced through the PMOS transistor 917 is in the form of extremely short duration (of the order of tens of picoseconds, e.g., no more than 100 ps or no more than 50 ps) current spike, equivalent to a broadband signal in the frequency domain. The broadband signal contains a frequency component at the $N^{th}$ harmonic frequency $\omega_1$ of the injected signal close to the resonant frequency $\omega_0$ of the oscillating signal in the LC tank circuit 920. This forces a phase correction of the oscillating signal in the LC tank circuit 920 at the frequency $\omega_1$, regardless of the phase of the oscillating signal in the LC tank circuit 920 at the time at which the injection current is applied.

In comparison to the injection locked oscillator 600 shown in FIG. 6, the injection locked oscillators 700, 800 and 900 shown in FIGS. 7, 8 and 9 provide various advantages. For example, as the NMOS transistors 717 and 817, and the PMOS transistor 917 are not directly connected to the LC tank circuits 720, 820 and 920 respectively, parasitic capacitance in the LC tank circuits 720, 820 and 920 is reduced. In addition, as the injection transistor is at the centre tap of the second inductive winding 815 (and equivalently 915), parasitics seen by the first inductive windings 811 (and equivalently 911) are also reduced.

FIGS. 10a-11b show arrangements of inductive windings that may be employed in the injection-locked oscillators 800 and 900 shown in FIGS. 8 and 9 to allow current injection into the LC tank circuits 820 and 920. In FIGS. 10a-11b, the winding arrangements are described with reference to the injection locked oscillator 800 shown in FIG. 8, however it will be appreciated that they are equally applicable to the injection locked oscillator 900 shown in FIG. 9.

Figure 10B:
FIGS. 10*a* and 10*b* schematically illustrate a first arrangement of inductive windings that may be employed with an injection-locked oscillator according to an embodiment of the present invention, and a first physical arrangement of said inductive windings in a CMOS circuit according to the present invention.
Figure 10B:
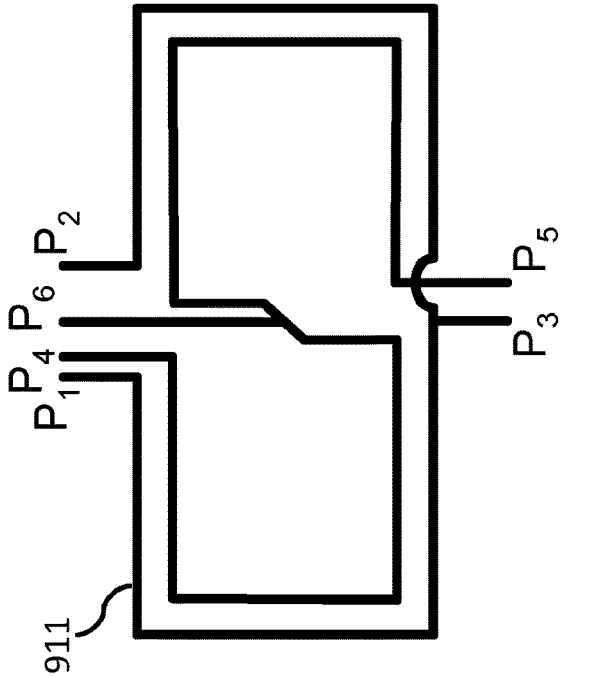
Figure 10A:
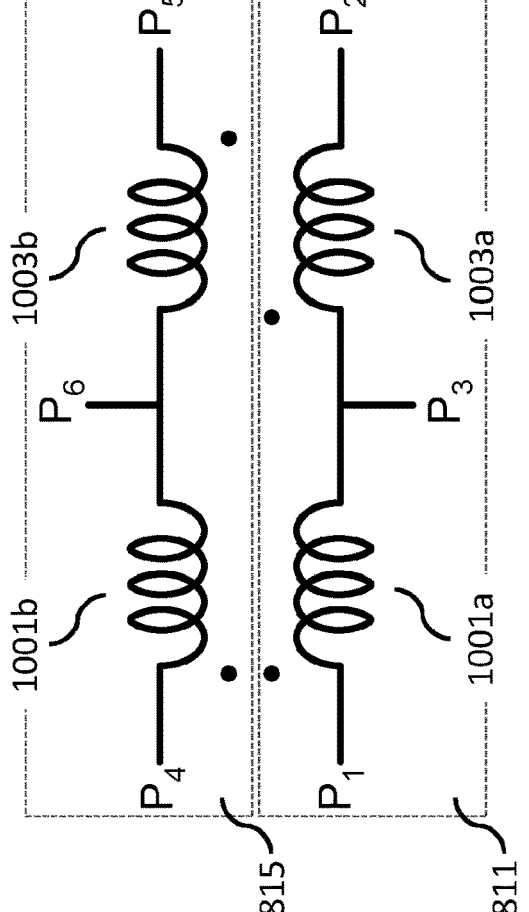

FIG. 10a shows an advantageous arrangement of the first inductive winding 811 and the second inductive winding 815 of the injection-locked oscillator 800 of FIG. 8 that results in reduced transfer of parasitic capacitance to the first inductive winding 811 of the tank circuit 820.

In the arrangement shown in FIG. 10a, the first inductive winding 811 can be seen to comprise three terminals, $P_1$, $P_2$ and $P_3$, and two winding parts, a first winding part 1001a, and a second winding part 1003a. Terminals $P_1$ and $P_2$ are connected at opposite sides of the LC tank circuit 820, while terminal $P_3$ is connected to a power supply rail, which serves to provide power to the transistors of the cross-coupled pair circuit 110 of the injection locked oscillator 800. The second inductive winding 815 also comprises three terminals, $P_4$, $P_5$ and $P_6$, and two winding parts: a third winding part 1001b, and a fourth winding part 1003b. Terminal $P_6$ is connected to the NMOS transistor 817 as shown in FIG. 8, while terminals $P_4$ and $P_5$ are both connected to the supply rail 816.

When a voltage is applied at the gate of the NMOS transistor 817, current flows from the supply rail 816 through the third winding part 1001b and the fourth winding part 1003b of the winding 815 to ground via the NMOS transistor 817.

The first winding part 1001a of the first inductive winding 811 and the third winding part 1001b of the second inductive winding 815 are arranged in a non-inverting configuration, i.e., such that a current is induced in the first winding part 1001a of the first inductive winding 811 that flows from one side of the tank circuit to the centre tap.

The second winding part 1003a of the first inductive winding 811 and the fourth winding part 1003b of the second inductive winding 815 are arranged in an inverting configuration, i.e. such that a current is induced in the second winding part 1003a of the first inductive winding 811 that flows from the centre tap to the other side of the tank circuit.

Thus, the current injected at $P_6$ induces a differential current across $P_1$-$P_2$.

The resulting current induced in the first inductive winding 811 therefore flows through the LC tank circuit 820, such that the injection of current enables oscillations in the tank circuit at $\omega_1$ to be sustained.

FIG. 10b provides an example of how the first and second inductive windings 911 and 815 respectively may be formed with one or more ultra-thick metal layers in CMOS technology. It can be seen that, in this arrangement, the first inductive winding 811 (with terminals $P_1$, $P_2$ and $P_3$) is formed in a loop that substantially surrounds the second inductive winding 815 (with terminals $P_4$, $P_5$ and $P_6$), and that the second inductive winding 815 is formed in a figure-of-eight pattern, such that a current can be induced in the first inductive winding 811.

Figures 11A, 11B:
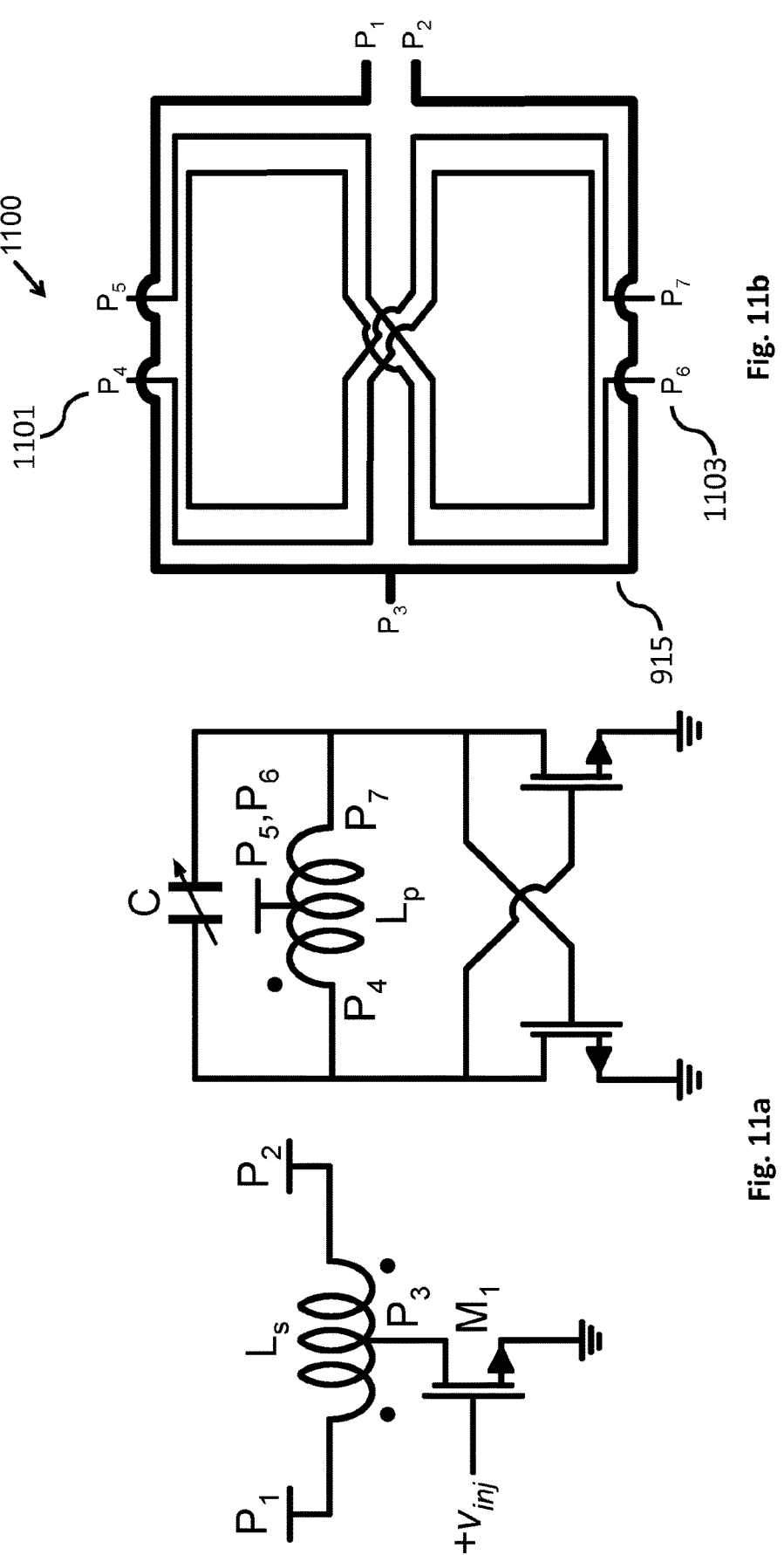
FIGS. 11*a* and 11*b* schematically illustrate an injection-locked oscillator according to an embodiment of the present invention and a second physical arrangement of inductive windings in a CMOS circuit according to the present invention.

FIGS. 11a and 11b show a second advantageous arrangement of the first inductive winding 811 and the second inductive winding 815 of the injection-locked oscillator 800 of FIG. 8 that may result in reduced transfer of parasitic capacitance to the first inductive winding 811 of the tank circuit 820.

The arrangement shown in FIG. 11a employs a trifilar winding arrangement in which the inductive winding 811 of the LC tank circuit 820 comprises first and second inductive winding parts 1101, 1103.

FIG. 11b provides a second example of how the first and second inductive windings 811 and 815 respectively may be formed with one or more ultra-thick metal layers in CMOS technology in practice. In the arrangement shown in FIG. 11b, the inductive winding 815 of the injection circuit (with terminals $P_1$, $P_2$ and $P_3$) is formed as a loop winding around the periphery of the first inductive winding part 1101 (with terminals $P_4$, $P_5$) and the second inductive winding part 1103 (with terminals $P_6$, $P_7$), such that it substantially surrounds the first and second inductive winding parts 1101 and 1103.

While shown in FIG. 11b as surrounding the first and second inductive winding parts 1101 and 1103, the inductive winding 815 of the injection circuit may, in some embodiments, be provided such that it is vertically offset relative to the first and second inductive winding parts 1101 and 1103, e.g., in a stacked configuration. For example, the first and second inductive winding parts 1101 and 1103 may be provided in a first layer, and the inductive winding 815 may be provided in a second layer. In such embodiments, it is not required that the inductive winding 815 of the injection circuit surrounds the first and second inductive winding parts 1101 and 1103, only that a current is induced in the first and second inductive winding parts 1101 and 1103 of the inductive winding 811 of the LC tank circuit.

As can be seen in FIG. 11b, the first inductive winding part 1101 and the second inductive winding part 1103 are both arranged in figure-of-eight patterns comprising respective first and second loops, and are interwound such that the second loop (the smaller loop shown in FIG. 11*b*) of the first inductive winding part 1101 is surrounded by the first loop of the second inductive winding part 1103, and the first loop (i.e. the larger loop shown in FIG. 11*b*) of the first inductive winding part 1101 surrounds the second loop of the second inductive winding part 1103. It will be appreciated however, that the first inductive winding part 1101 and the second inductive winding part 1103 could instead be arranged in concentric figure of eight patterns, such that a figure of eight formed by the first inductive winding part 1101 is substantially surrounded by a figure of eight formed by the second inductive winding part 1103 or vice-versa. Equally, the two figure of eight windings could be formed in a stacked configuration in separate layers. It will be appreciated that in other embodiments one of the figure of eight windings could be formed in the same layer as the loop winding 815 in a concentric arrangement, e.g. with the loop surrounding the figure of eight.

In this arrangement, the current in the inductive winding 815 causes a corresponding current to be induced in the first inductive winding part 1101 and the second inductive winding part 1103, which together form the inductive winding 811 of the LC tank circuit 820.

It will be appreciated by those skilled in the art that the invention has been illustrated by describing one or more specific embodiments thereof, but is not limited to these embodiments; many variations and modifications are possible, within the scope of the accompanying claims.

The invention claimed is:

1. An electronic oscillator circuit comprising:
a tank circuit comprising a first inductive winding and a capacitor; and
an injection circuit comprising a second inductive winding and a current controller;
wherein the injection circuit is not electrically connected to the tank circuit;
wherein the current controller is configured such that when it is in a first state, an injected current flows from the current controller through the second inductive winding;
wherein the current controller is configured such that when it is in a second state, no injected current flows through the second inductive winding; and
wherein the first inductive winding and the second inductive winding are coupled such that the injected current in the second inductive winding of the injection circuit causes a corresponding injected current to be induced in the first inductive winding of the tank circuit;
wherein the current controller is an NMOS transistor, arranged such that the source of the NMOS transistor is connected to ground or other sink of current;
wherein a first terminal and a second terminal of the second inductive winding are connected to a power supply rail or other supply of current; and
wherein a third terminal of the second inductive winding is connected to the drain of the NMOS transistor;
wherein the third terminal is a centre tap of the second inductive winding.

2. The electronic oscillator circuit of claim 1, wherein the first inductive winding comprises a first winding part and a second winding part;
wherein the first winding part is connected between a first side of the tank circuit and a central terminal;
wherein the second winding part is connected between a second side of the tank circuit and the central terminal;

wherein the induced current in the first winding part flows from the central terminal towards the first side of the tank circuit; and
wherein the induced current in the second winding part flows from the second side of the tank circuit towards the central terminal.

3. The electronic oscillator circuit of claim 1, further comprising a first cross-coupled pair circuit connected to the tank circuit.

4. The electronic oscillator circuit of claim 3, wherein the first cross-coupled pair circuit comprises a pair of cross-coupled PMOS transistors, the source of each of the PMOS transistors being connected to a power supply rail or other supply of current.

5. The electronic oscillator circuit of claim 1, further comprising a second cross-coupled pair circuit connected to the tank circuit.

6. The electronic oscillator circuit of claim 5, wherein the second cross-coupled pair circuit comprises a pair of cross-coupled NMOS transistors, the source of each of the NMOS transistors being connected to ground or other sink of current.

7. The electronic oscillator circuit of claim 1, further comprising an injection clock source, wherein the injection clock source is configured to apply a clock signal to the current controller in the injection circuit with a predetermined duty-cycle such that the current controller transitions from the second state to the first state at a frequency set by said duty-cycle.

8. The electronic oscillator of claim 7, wherein the injection clock source is configured to cause the current controller to transition from the second state to the first state at a frequency close to, or having a harmonic component close to, the resonant frequency of the tank circuit.

9. The electronic oscillator of claim 1, wherein the capacitor and the inductive winding are connected in parallel in the tank circuit.

10. The electronic oscillator of claim 1, wherein the capacitor is a variable capacitor.

11. An electronic oscillator circuit comprising:
a tank circuit comprising an inductor and a capacitor, wherein the inductor and the capacitor each have a first terminal connected to a first side of the tank circuit and a second terminal connected to a second side of the tank circuit;
a PMOS transistor; and
an NMOS transistor;
wherein the PMOS transistor is connected to the first side of the tank circuit;
wherein the NMOS transistor is connected to the second side of the tank circuit;
wherein the PMOS transistor is arranged such that it can act as a current source for the tank circuit;
wherein the NMOS transistor is arranged such that it can act as a current sink for the tank circuit;
wherein the PMOS transistor and the NMOS transistor are configured such that when the PMOS transistor and the NMOS transistor are in a first state, an injected current is introduced into the tank circuit from the PMOS transistor, and flows out of the circuit through the NMOS transistor; and
when the first PMOS transistor and the NMOS transistor are in a second state, no current is injected into the tank circuit.

12. The electronic oscillator circuit of claim 11, further comprising a first cross-coupled pair circuit connected to the tank circuit.

13. The electronic oscillator circuit of claim 12, wherein the first cross-coupled pair circuit comprises a pair of cross-coupled PMOS transistors, the source of each of the PMOS transistors being connected to a power supply rail or other supply of current.

14. The electronic oscillator circuit of claim 11, further comprising a second cross-coupled pair circuit connected to the tank circuit.

15. The electronic oscillator of claim 14, wherein the second cross-coupled pair circuit comprises a pair of cross-coupled NMOS transistors, the source of each of the NMOS transistors being connected to ground or other sink of current.

16. The electronic oscillator circuit of claim 11, further comprising an injection clock source, wherein the injection clock source is configured to apply a clock signal to the PMOS transistor and the NMOS transistor with a predetermined duty-cycle such that the PMOS transistor and the NMOS transistor transition from the second state to the first state at a frequency set by said duty-cycle of the injection clock source.

17. The electronic oscillator of claim 16, wherein the injection clock source is configured to cause the PMOS transistor and the NMOS transistor to transition from the second state to the first state at a frequency close to, or having a harmonic component close to, the resonant frequency of the tank circuit.

18. The electronic oscillator of claim 11, wherein the capacitor and inductor are connected in parallel in the tank circuit.

19. The electronic oscillator of claim 11, wherein the capacitor is a variable capacitor.

20. An electronic oscillator circuit comprising:

a tank circuit comprising a first inductive winding and a capacitor; and an injection circuit comprising a second inductive winding and a current controller;

wherein the injection circuit is not electrically connected to the tank circuit;

wherein the current controller is configured such that when it is in a first state, an injected current flows from the current controller through the second inductive winding;

wherein the current controller is configured such that when it is in a second state, no injected current flows through the second inductive winding; and wherein the first inductive winding and the second inductive winding are coupled such that the injected current in the second inductive winding of the injection circuit causes a corresponding injected current to be induced in the first inductive winding of the tank circuit;

wherein the current controller is a PMOS transistor, arranged such that the source of the PMOS transistor is connected to a power supply rail or other supply of current;

wherein a first terminal and a second terminal of the second inductive winding are connected to ground or other sink of current; and wherein a third terminal of the second inductive winding is connected to the drain of the PMOS transistor;

wherein the third terminal is a centre tap of the second inductive winding.

21. The electronic oscillator circuit of claim 20, wherein the first inductive winding comprises a first winding part and a second winding part;

wherein the first winding part is connected between a first side of the tank circuit and a central terminal;

wherein the second winding part is connected between a second side of the tank circuit and the central terminal;

wherein the induced current in the first winding part flows from the central terminal towards the first side of the tank circuit; and wherein the induced current in the second winding part flows from the second side of the tank circuit towards the central terminal.

\* \* \* \* \*